United States Patent
Sarkis et al.

(10) Patent No.: US 11,470,591 B2
(45) Date of Patent: Oct. 11, 2022

(54) DIRECT TRANSPORT BLOCK SIZE SPECIFICATION

(71) Applicant: QUALCOMM Incorporated, San Diego, CA (US)

(72) Inventors: Gabi Sarkis, San Diego, CA (US); Jing Jiang, San Diego, CA (US); Joseph Binamira Soriaga, San Diego, CA (US); Ying Wang, San Diego, CA (US); Wei Yang, San Diego, CA (US); Chih-Ping Li, San Diego, CA (US); Wanshi Chen, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/406,510

(22) Filed: May 8, 2019

(65) Prior Publication Data

US 2019/0349900 A1 Nov. 14, 2019

Related U.S. Application Data

(60) Provisional application No. 62/669,917, filed on May 10, 2018.

(51) Int. Cl.
*H04W 72/04* (2009.01)
*H03M 13/11* (2006.01)
*H04L 1/00* (2006.01)

(52) U.S. Cl.
CPC ..... *H04W 72/042* (2013.01); *H03M 13/1102* (2013.01); *H04L 1/0016* (2013.01); *H04L 1/0023* (2013.01); *H04L 1/0028* (2013.01)

(58) Field of Classification Search
CPC ... H04L 1/0016; H04L 1/0023; H04L 1/0028; H04L 5/0053; H04L 5/0064
See application file for complete search history.

(56) References Cited

U.S. PATENT DOCUMENTS

| 8,953,659 B2* | 2/2015 | Amini | H04L 1/0015 |
| | | | 375/219 |
| 2009/0028261 A1* | 1/2009 | Zhang | H04L 1/1812 |
| | | | 375/261 |

(Continued)

FOREIGN PATENT DOCUMENTS

EP    2978153 A1    1/2016

OTHER PUBLICATIONS

Ericsson: "TB sizes and UL grant for Msg3", 3GPP Draft; R2-1805178—TB Sizes and UL Grant for MSG3, 3rd Generation Partnership Project (3GPP), Mobile Competence Centre, 650, Route Des Lucioles, F-06921, Sophia-Antipolis Cedex, France, vol. Ran WG2, No. Sanya, P.R. of China; Apr. 16, 2018-Apr. 20. 2018, Apr. 14, 2018 (Apr. 14, 2018), XP051428854, 12 Pages, Retrieved from the Internet: URL:http://www.3gpp.org/ftp/Meetings%5F3GPP%5FSYNC/RAN2/Docs/ [retrieved on Apr. 14, 2018], Sections 2 and 3.

(Continued)

*Primary Examiner* — Redentor Pasia
(74) *Attorney, Agent, or Firm* — Patterson & Sheridan, L.L.P

(57) ABSTRACT

Certain aspects of the present disclosure provide techniques for wireless communication. An exemplary method generally includes receiving an indication of a modulation and coding scheme (MCS) to use for transmitting information, wherein the indication of the MCS indicates an MCS index value corresponding to an entry in an MCS lookup table, determining, based on the MCS index value, a transport block size (TBS) to use for transmitting the information, wherein determining the TBS comprises receiving an explicit indication of the TBS to use for transmitting the information, and transmitting the information using the MCS and TBS.

22 Claims, 15 Drawing Sheets

(56) References Cited

U.S. PATENT DOCUMENTS

| | | | | |
|---|---|---|---|---|
| 2012/0275399 | A1* | 11/2012 | Liu | H04W 28/065 370/329 |
| 2014/0161108 | A1* | 6/2014 | Lohr | H04L 5/0039 370/336 |
| 2014/0192732 | A1* | 7/2014 | Chen | H04L 1/0009 370/329 |
| 2014/0254495 | A1* | 9/2014 | Farmanbar | H04W 72/12 370/329 |
| 2015/0117396 | A1* | 4/2015 | Wang | H04L 5/0091 370/330 |
| 2015/0195818 | A1* | 7/2015 | Davydov | H04W 72/042 370/329 |
| 2015/0195819 | A1* | 7/2015 | Kwon | H04L 1/0001 370/329 |
| 2015/0215068 | A1* | 7/2015 | Wu | H04L 1/0016 370/329 |
| 2016/0013918 | A1* | 1/2016 | Zhang | H04W 72/0413 370/329 |
| 2016/0112898 | A1* | 4/2016 | Chen | H04W 28/18 370/235 |
| 2016/0183276 | A1* | 6/2016 | Marinier | H04W 72/02 370/329 |
| 2016/0205564 | A1* | 7/2016 | Ren | H04L 27/362 370/252 |
| 2016/0269218 | A1* | 9/2016 | Zhang | H04L 27/362 |
| 2018/0014320 | A1* | 1/2018 | Xu | H04L 5/0007 |
| 2018/0048498 | A1* | 2/2018 | Stern-Berkowitz | H04W 72/1268 |
| 2018/0102890 | A1* | 4/2018 | Yi | H04L 5/0053 |
| 2018/0288795 | A1* | 10/2018 | Zhang | H04L 1/1822 |
| 2019/0045554 | A1* | 2/2019 | Ye | H04L 5/001 |
| 2019/0149287 | A1* | 5/2019 | Cheng | H04L 1/0009 370/280 |
| 2019/0223160 | A1* | 7/2019 | He | H04W 72/042 |
| 2019/0379511 | A1* | 12/2019 | Xu | H04L 5/0037 |
| 2020/0119958 | A1* | 4/2020 | Bayesteh | H04J 13/18 |
| 2020/0153538 | A1* | 5/2020 | Chen | H04L 1/0005 |
| 2020/0154467 | A1* | 5/2020 | Gong | H04W 72/1268 |

OTHER PUBLICATIONS

International Search Report and Written Opinion—PCT/US2019/031576—ISA/EPO—dated Jul. 18, 2019.

Mediatek Inc: "On the issues of BG selection", 3GPP Draft; R1-1721543 On the Issues of BG Selection Final, 3rd Generation Partnership Project (3GPP), Mobile Competence Centre ; 650, Route Des Lucioles ; F-06921 Sophia-Antipolis Cedex; France, vol. RAN WG1, No. Reno. USA; Nov. 27, 2017-Dec. 1, 2017, Dec. 1, 2017 (Dec. 1, 2017), XP051370595, 7 Pages, Retrieved from the Internet: URL:http://www.3gpp.org/ftp/tsg%5Fran/WG1%5FRL1/TSGR1%5F91/Docs/ [retrieved on Dec. 1, 2017], Section 2.2.

Qualcomm Incorporated: "Considerations for CQI and MCS for URLLC", 3GPP Draft; R1-1807376 Considerations for CQI and MCS for URLLC, 3rd Generation Partnership Project (3GPP), Mobile Competence Centre ; 650, Route Des Lucioles; F-06921 Sophia-Antipolis Cedex; France, vol. RAN WG1, No. Busan, Republic of Korea; May 21, 2018-May 25, 2018, May 12, 2018 (May 12, 2018), XP051463067, 15 Pages, Retrieved from the Internet: URL:http://www.3gpp.org/ftp/tsg%5Fran/WG1%5FRL1/TSGR1%5F93/Docs [retrieved on May 12, 2018], Section 4.

\* cited by examiner

DIRECT TRANSPORT BLOCK SIZE SPECIFICATION

CLAIM OF PRIORITY UNDER 35 U.S.C. § 119

This application claims benefit of U.S. Provisional Patent Application Ser. No. 62/669,917, filed May 10, 2018, which is herein incorporated by reference in its entirety.

FIELD OF THE DISCLOSURE

Aspects of the present disclosure relate to wireless communications, and more particularly, to techniques for direct transport block size specification.

DESCRIPTION OF RELATED ART

Wireless communication systems are widely deployed to provide various telecommunication services such as telephony, video, data, messaging, broadcasts, etc. These wireless communication systems may employ multiple-access technologies capable of supporting communication with multiple users by sharing available system resources (e.g., bandwidth, transmit power, etc.). Examples of such multiple-access systems include 3rd Generation Partnership Project (3GPP) Long Term Evolution (LTE) systems, LTE Advanced (LTE-A) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems, to name a few.

In some examples, a wireless multiple-access communication system may include a number of base stations (BSs), which are each capable of simultaneously supporting communication for multiple communication devices, otherwise known as user equipments (UEs). In an LTE or LTE-A network, a set of one or more base stations may define an eNodeB (eNB). In other examples (e.g., in a next generation, a new radio (NR), or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., which may be referred to as a base station, 5G NB, next generation NodeB (gNB or gNodeB), TRP, etc.). A base station or distributed unit may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. New Radio (NR) (e.g., 5G) is an example of an emerging telecommunication standard. NR is a set of enhancements to the LTE mobile standard promulgated by 3GPP. It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL). To these ends, NR supports beamforming, multiple-input multiple-output (MIMO) antenna technology, and carrier aggregation.

However, as the demand for mobile broadband access continues to increase, there exists a need for further improvements in NR and LTE technology. Preferably, these improvements should be applicable to other multi-access technologies and the telecommunication standards that employ these technologies.

BRIEF SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects provide a method for wireless communication. The method generally includes receiving an indication of a modulation and coding scheme (MCS) to use for transmitting information, wherein the indication of the MCS indicates an MCS index value corresponding to an entry in an MCS lookup table, determining, based on the MCS index value, a transport block size (TBS) to use for transmitting the information, wherein determining the TBS comprises receiving an explicit indication of the TBS to use for transmitting the information, and transmitting the information using the MCS and TBS.

Certain aspects provide an apparatus for wireless communication. The apparatus generally includes at least one processor configured to receive an indication of a modulation and coding scheme (MCS) to use for transmitting information, wherein the indication of the MCS indicates an MCS index value corresponding to an entry in an MCS lookup table, determine, based on the MCS index value, a transport block size (TBS) to use for transmitting the information, wherein determining the TBS comprises receiving an explicit indication of the TBS to use for transmitting the information, and transmit the information using the MCS and TBS. The apparatus also generally includes a memory coupled with the at least one processor.

Certain aspects provide an apparatus for wireless communication. The apparatus generally includes means for receiving an indication of a modulation and coding scheme (MCS) to use for transmitting information, wherein the indication of the MCS indicates an MCS index value corresponding to an entry in an MCS lookup table, means for determining, based on the MCS index value, a transport block size (TBS) to use for transmitting the information, wherein determining the TBS comprises receiving an explicit indication of the TBS to use for transmitting the information, and means for transmitting the information using the MCS and TBS.

Certain aspects provide a non-transitory computer-readable medium for wireless communication. The non-transitory computer-readable medium generally includes instructions that, when executed by at least one processor, cause the at least one processor to receive an indication of a modulation and coding scheme (MCS) to use for transmitting information, wherein the indication of the MCS indicates an MCS index value corresponding to an entry in an MCS lookup table, determine, based on the MCS index value, a transport block size (TBS) to use for transmitting the information, wherein determining the TBS comprises receiving an explicit indication of the TBS to use for transmitting the information, and transmit the information using the MCS and TBS.

Certain aspects provide a method for wireless communication. The method generally includes transmitting an indication of a modulation and coding scheme (MCS) to use for transmitting information, wherein the indication of the MCS indicates an MCS index value corresponding to an entry in an MCS lookup table, transmitting an explicit indication of the TBS to use for transmitting the information, wherein the explicit indication of the TBS corresponds to the MCS index value, and receiving the information transmitted using the MCS and TBS.

Certain aspects provide an apparatus for wireless communication. The apparatus generally includes at least one processor configured to transmit an indication of a modulation and coding scheme (MCS) to use for transmitting information, wherein the indication of the MCS indicates an MCS index value corresponding to an entry in an MCS lookup table, transmit an explicit indication of the TBS to use for transmitting the information, wherein the explicit indication of the TBS corresponds to the MCS index value, and receive the information transmitted using the MCS and TBS. The apparatus also generally includes a memory coupled with the at least one processor.

Certain aspects provide an apparatus for wireless communication. The apparatus generally includes means for transmitting an indication of a modulation and coding scheme (MCS) to use for transmitting information, wherein the indication of the MCS indicates an MCS index value corresponding to an entry in an MCS lookup table, means for transmitting an explicit indication of the TBS to use for transmitting the information, wherein the explicit indication of the TBS corresponds to the MCS index value, and means for receiving the information transmitted using the MCS and TBS.

Certain aspects provide a non-transitory computer-readable medium for wireless communication. The non-transitory computer-readable medium generally includes instructions that, when executed by at least one processor, cause the at least one processor to transmit an indication of a modulation and coding scheme (MCS) to use for transmitting information, wherein the indication of the MCS indicates an MCS index value corresponding to an entry in an MCS lookup table, transmit an explicit indication of the TBS to use for transmitting the information, wherein the explicit indication of the TBS corresponds to the MCS index value, and receive the information transmitted using the MCS and TBS.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
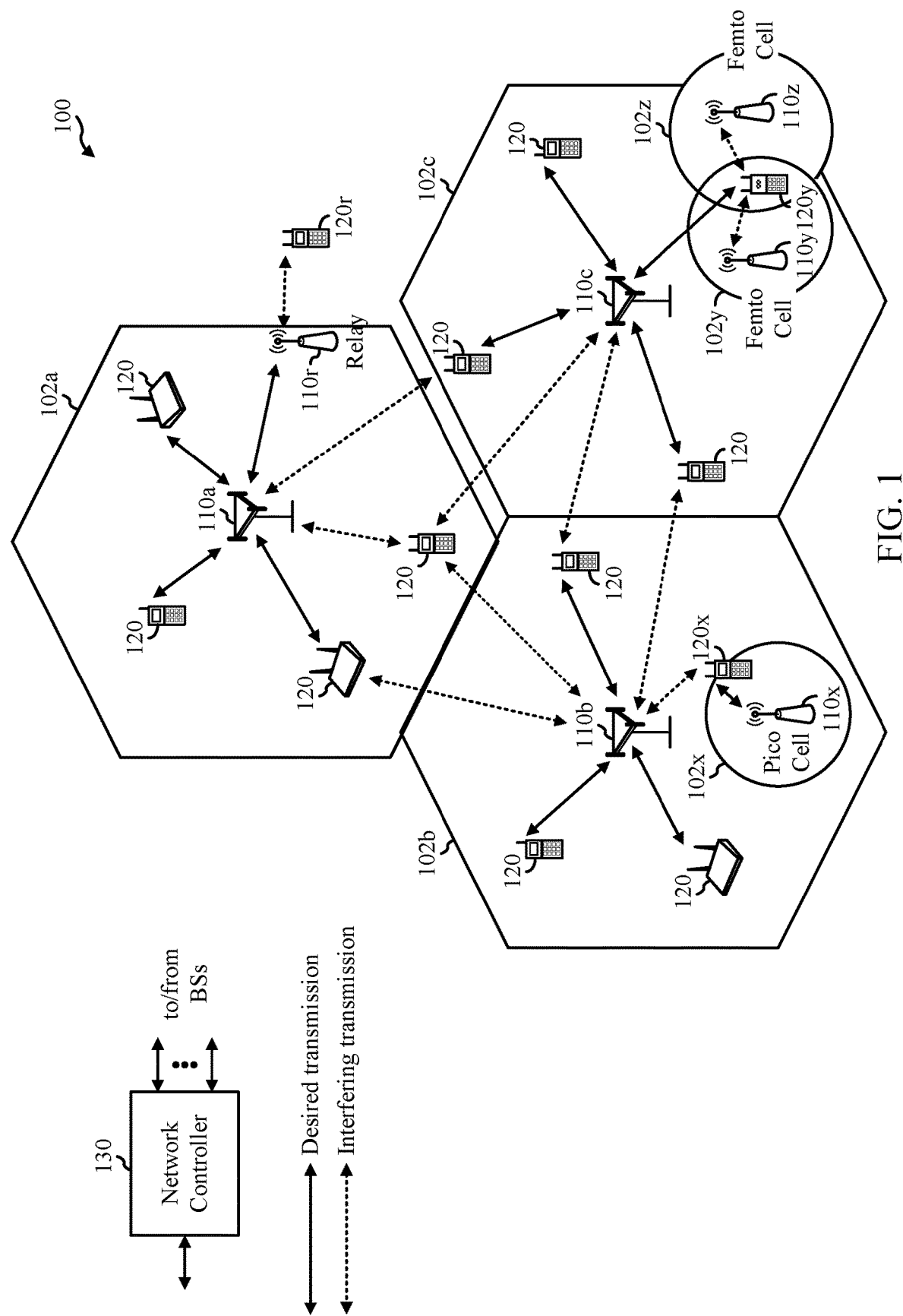
FIG. 1 is a block diagram conceptually illustrating an example telecommunications system, in accordance with certain aspects of the present disclosure.

Aspects of the present disclosure provide apparatus, methods, processing systems, and computer readable mediums for direct transport block size (TBS) specification. For example, in LTE, transport block size (TBS) may be calculated based on a TBS index from a modulation and coding scheme (MCS) lookup table and another lookup table based on allocated resources. In 5G NR, TBS may be calculated based on allocated resources, modulation order, and target coding rates. However, as a result, in some cases, it can be more difficult to achieve a desired TBS in 5G NR than in LTE due to spectral efficiency.

Thus, aspects of the present disclosure provide techniques for achieving a desired TBS in 5G NR without compromising performance or scheduler flexibility (e.g., MCS entries and/or spectral efficiency and resource allocation that may be used to reach a desired/target TBS). For example, unlike LTE which keeps the spectral efficiency relatively the same within an MCS index value, aspects of the present disclosure propose techniques to achieve a desired TBS with variable spectral efficiency.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to, or other than, the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication technologies, such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS).

New Radio (NR) is an emerging wireless communications technology under development in conjunction with the 5G Technology Forum (5GTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

New radio (NR) access (e.g., 5G technology) may support various wireless communication services, such as enhanced mobile broadband (eMBB) targeting wide bandwidth (e.g., 80 MHz or beyond), millimeter wave (mmW) targeting high carrier frequency (e.g., 25 GHz or beyond), massive machine type communications MTC (mMTC) targeting non-backward compatible MTC techniques, and/or mission critical targeting ultra-reliable low-latency communications (URLLC). These services may include latency and reliability requirements. These services may also have different transmission time intervals (TTI) to meet respective quality of service (QoS) requirements. In addition, these services may co-exist in the same subframe.

Example Wireless Communications System

FIG. 1 illustrates an example wireless communication network 100. According to aspects presented herein, the wireless communications network may be a may be a New Radio (NR) or 5G network in which aspects provided herein may be practiced. For example, in some cases, techniques for achieving a desired TBS in 5G NR without compromising performance or scheduler flexibility, as described below, may be practiced by one or more of the base stations or user equipments disclosed in FIG. 1. In some cases, achieving a desired TBS in 5G NR without compromising performance or scheduler flexibility may involve defining a new type of MCS entry in an MCS lookup table that explicitly indicate a desired TBS to be used by a base station and/or user equipment when transmitting information.

As illustrated in FIG. 1, the wireless communication network 100 may include a number of base stations (BSs) 110 and other network entities. ABS may be a station that communicates with user equipments (UEs). Each BS 110 may provide communication coverage for a particular geographic area. In 3GPP, the term "cell" can refer to a coverage area of a Node B (NB) and/or a Node B subsystem serving this coverage area, depending on the context in which the term is used. In NR systems, the term "cell" and next generation NodeB (gNB), new radio base station (NR BS), 5G NB, access point (AP), or transmission reception point (TRP) may be interchangeable. In some examples, a cell may not necessarily be stationary, and the geographic area of the cell may move according to the location of a mobile BS. In some examples, the base stations may be interconnected to one another and/or to one or more other base stations or network nodes (not shown) in wireless communication network 100 through various types of backhaul interfaces, such as a direct physical connection, a wireless connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a subcarrier, a frequency channel, a tone, a subband, etc. Each frequency may support a single RAT in a given geographic area in order to avoid interference between wireless networks of different RATs. In some cases, NR or 5G RAT networks may be deployed.

A base station (BS) may provide communication coverage for a macro cell, a pico cell, a femto cell, and/or other types of cells. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having an association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BSs for the femto cells 102y and 102z, respectively. A BS may support one or multiple (e.g., three) cells.

Wireless communication network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

Wireless communication network 100 may be a heterogeneous network that includes BSs of different types, e.g., macro BS, pico BS, femto BS, relays, etc. These different types of BSs may have different transmit power levels, different coverage areas, and different impact on interference in the wireless communication network 100. For example, macro BS may have a high transmit power level (e.g., 20 Watts) whereas pico BS, femto BS, and relays may have a lower transmit power level (e.g., 1 Watt).

Wireless communication network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may couple to a set of BSs and provide coordination and control for these BSs. The network controller 130 may communicate with the BSs 110 via a backhaul. The BSs 110 may also communicate with one another (e.g., directly or indirectly) via wireless or wireline backhaul.

The UEs 120 (e.g., 120x, 120y, etc.) may be dispersed throughout the wireless communication network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet computer, a camera, a gaming device, a netbook, a smartbook, an ultrabook, an appliance, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, which may be narrowband IoT (NB-IoT) devices.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a "resource block" (RB)) may be 12 subcarriers (or 180 kHz). Consequently, the nominal Fast Fourier Transfer (FFT) size may be equal to 128, 256, 512, 1024 or 2048 for system bandwidth of 1.25, 2.5, 5, 10, or 20 megahertz (MHz), respectively. The system bandwidth may also be partitioned into subbands. For example, a subband may cover 1.08 MHz (i.e., 6 resource blocks), and there may be 1, 2, 4, 8, or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using TDD. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells.

In some examples, access to the air interface may be scheduled, wherein a. A scheduling entity (e.g., a base station) allocates resources for communication among some or all devices and equipment within its service area or cell. The scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. In some examples, a UE may function as a scheduling entity and may schedule resources for one or more subordinate entities (e.g., one or more other UEs), and the other UEs may utilize the resources scheduled by the UE for wireless communication. In some examples, a UE may function as a scheduling entity in a peer-to-peer (P2P) network, and/or in a mesh network. In a mesh network example, UEs may communicate directly with one another in addition to communicating with a scheduling entity.

In FIG. 1, a solid line with double arrows indicates desired transmissions between a UE and a serving BS, which is a BS designated to serve the UE on the downlink and/or uplink. A finely dashed line with double arrows indicates interfering transmissions between a UE and a BS.

Figure 2:
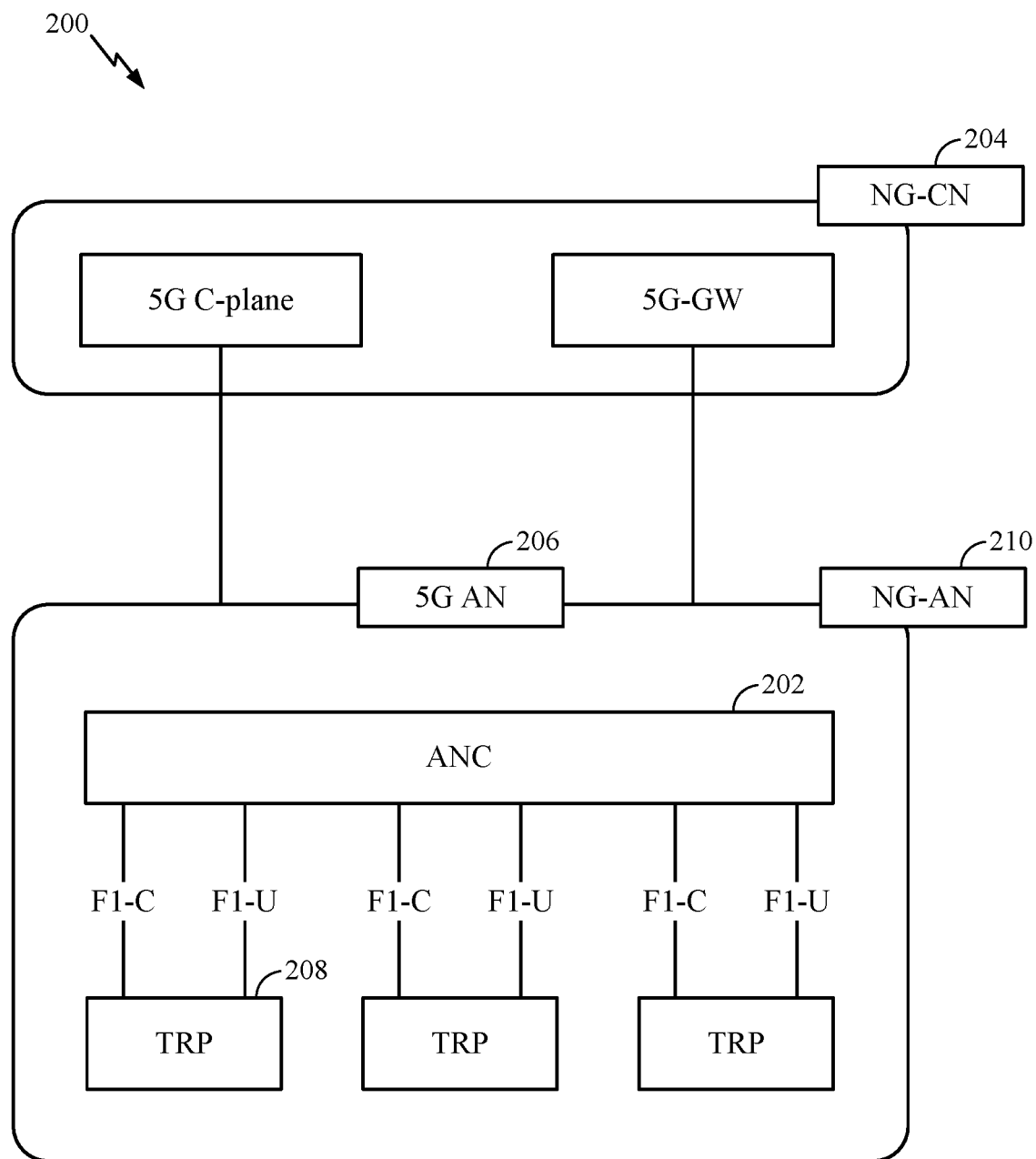
FIG. 2 is a block diagram illustrating an example logical architecture of a distributed radio access network (RAN), in accordance with certain aspects of the present disclosure.

FIG. 2 illustrates an example logical architecture of a distributed Radio Access Network (RAN) 200, which may be implemented in the wireless communication network 100 illustrated in FIG. 1. A 5G access node 206 may include an access node controller (ANC) 202. ANC 202 may be a central unit (CU) of the distributed RAN 200. The backhaul interface to the Next Generation Core Network (NG-CN) 204 may terminate at ANC 202. The backhaul interface to neighboring next generation access Nodes (NG-ANs) 210 may terminate at ANC 202. ANC 202 may include one or more transmission reception points (TRPs) 208 (e.g., cells, B Ss, gNBs, etc.).

The TRPs 208 may be a distributed unit (DU). TRPs 208 may be connected to a single ANC (e.g., ANC 202) or more than one ANC (not illustrated). For example, for RAN sharing, radio as a service (RaaS), and service specific AND deployments, TRPs 208 may be connected to more than one ANC. TRPs 208 may each include one or more antenna ports. TRPs 208 may be configured to individually (e.g., dynamic selection) or jointly (e.g., joint transmission) serve traffic to a UE.

The logical architecture of distributed RAN 200 may support fronthauling solutions across different deployment types. For example, the logical architecture may be based on transmit network capabilities (e.g., bandwidth, latency, and/or jitter).

The logical architecture of distributed RAN 200 may share features and/or components with LTE. For example, next generation access node (NG-AN) 210 may support dual connectivity with NR and may share a common fronthaul for LTE and NR.

The logical architecture of distributed RAN 200 may enable cooperation between and among TRPs 208, for example, within a TRP and/or across TRPs via ANC 202. An inter-TRP interface may not be used.

Logical functions may be dynamically distributed in the logical architecture of distributed RAN 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU (e.g., TRP 208) or CU (e.g., ANC 202).

Figure 3:
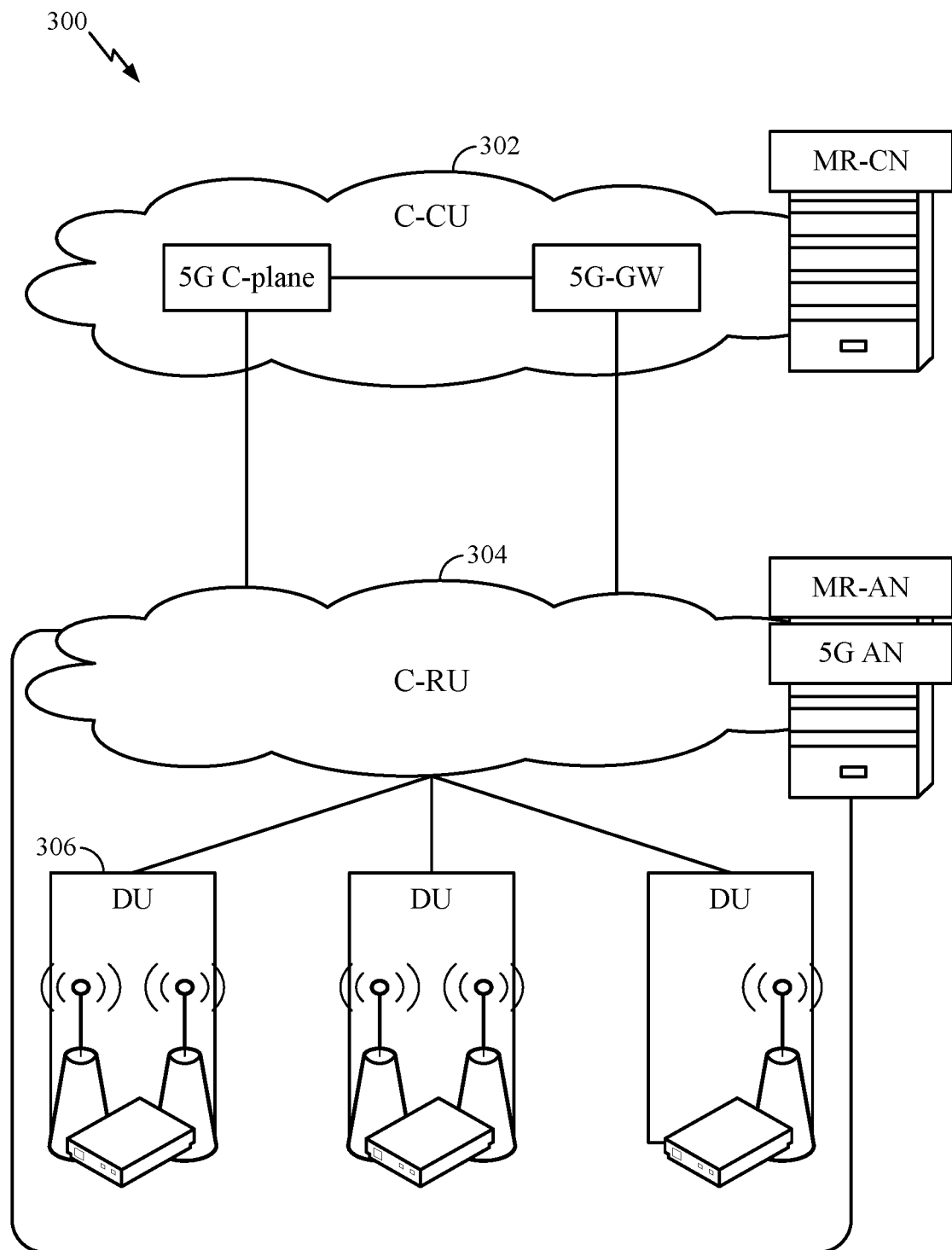
FIG. 3 is a diagram illustrating an example physical architecture of a distributed RAN, in accordance with certain aspects of the present disclosure.

FIG. 3 illustrates an example physical architecture of a distributed Radio Access Network (RAN) 300, according to aspects of the present disclosure. A centralized core network unit (C-CU) 302 may host core network functions. C-CU 302 may be centrally deployed. C-CU 302 functionality may be offloaded (e.g., to advanced wireless services (AWS)), in an effort to handle peak capacity.

A centralized RAN unit (C-RU) 304 may host one or more ANC functions. Optionally, the C-RU 304 may host core network functions locally. The C-RU 304 may have distributed deployment. The C-RU 304 may be close to the network edge.

A DU 306 may host one or more TRPs (Edge Node (EN), an Edge Unit (EU), a Radio Head (RH), a Smart Radio Head (SRH), or the like). The DU may be located at edges of the network with radio frequency (RF) functionality.

Figure 4:
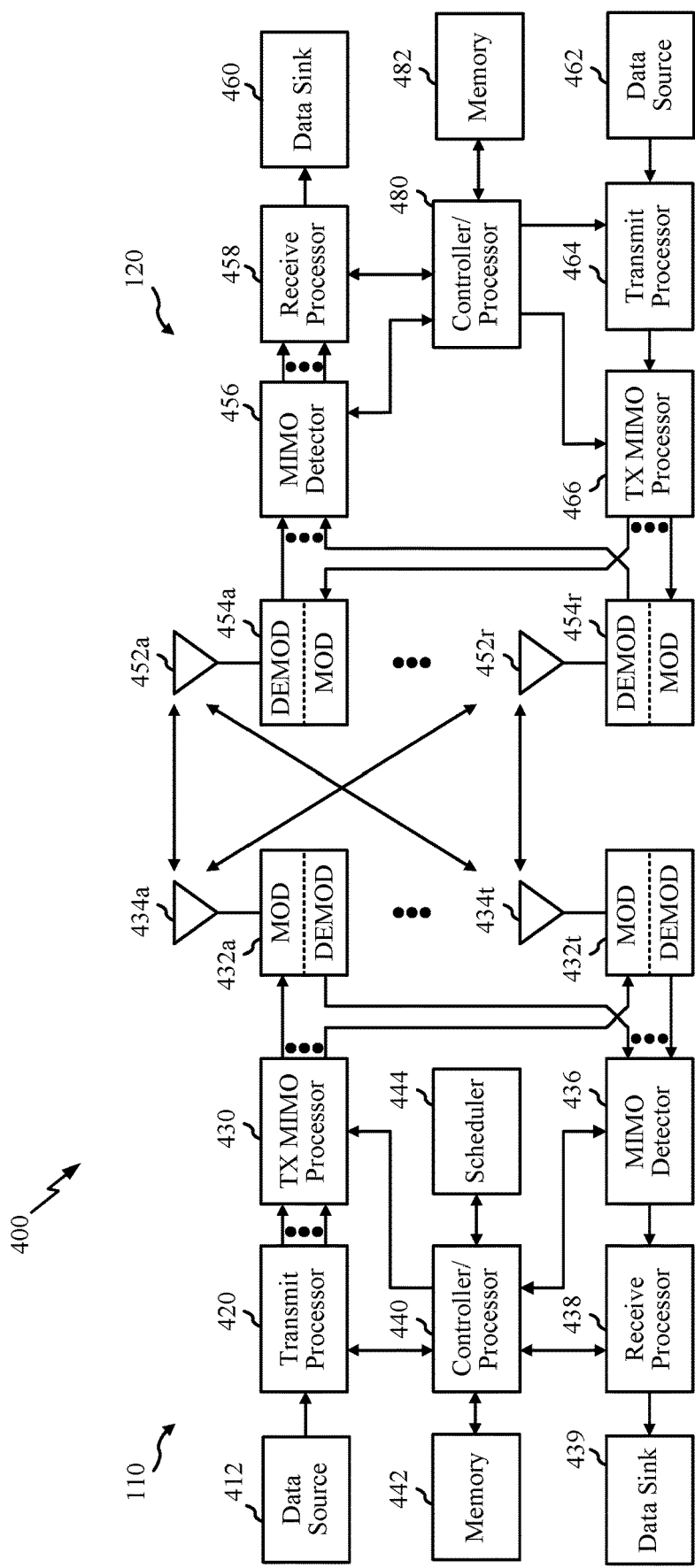
FIG. 4 is a block diagram conceptually illustrating a design of an example base station (BS) and user equipment (UE), in accordance with certain aspects of the present disclosure.

FIG. 4 illustrates example components of BS 110 and UE 120 (as depicted in FIG. 1), which may be used to implement aspects of the present disclosure. For example, antennas 452, processors 466, 458, 464, and/or controller/processor 480 of the UE 120 and/or antennas 434, processors 420, 480, 438, and/or controller/processor 440 of the BS 110 may be used to perform the various techniques and methods described herein.

At the BS 110, a transmit processor 420 may receive data from a data source 412 and control information from a controller/processor 440. The control information may be for the physical broadcast channel (PBCH), physical control format indicator channel (PCFICH), physical hybrid ARQ indicator channel (PHICH), physical downlink control channel (PDCCH), group common PDCCH (GC PDCCH), etc. The data may be for the physical downlink shared channel (PDSCH), etc. The processor 420 may process (e.g., encode and symbol map) the data and control information to obtain data symbols and control symbols, respectively. The processor 420 may also generate reference symbols, e.g., for the primary synchronization signal (PSS), secondary synchronization signal (SSS), and cell-specific reference signal (CRS). A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432a through 432t. Each modulator 432 may process a respective output symbol stream (e.g., for OFDM, etc.) to obtain an output sample stream. Each modulator may further process (e.g., convert to analog, amplify, filter, and upconvert) the output sample stream to obtain a downlink signal. Downlink signals from modulators 432a through 432t may be transmitted via the antennas 434a through 434t, respectively.

At the UE 120, the antennas 452a through 452r may receive the downlink signals from the base station 110 and may provide received signals to the demodulators (DEMODs) in transceivers 454a through 454r, respectively. Each demodulator 454 may condition (e.g., filter, amplify, downconvert, and digitize) a respective received signal to obtain input samples. Each demodulator may further process the input samples (e.g., for OFDM, etc.) to obtain received symbols. A MIMO detector 456 may obtain received symbols from all the demodulators 454a through 454r, perform MIMO detection on the received symbols if applicable, and provide detected symbols. A receive processor 458 may process (e.g., demodulate, deinterleave, and decode) the detected symbols, provide decoded data for the UE 120 to a data sink 460, and provide decoded control information to a controller/processor 480.

On the uplink, at UE 120, a transmit processor 464 may receive and process data (e.g., for the physical uplink shared channel (PUSCH)) from a data source 462 and control information (e.g., for the physical uplink control channel (PUCCH) from the controller/processor 480. The transmit processor 464 may also generate reference symbols for a reference signal (e.g., for the sounding reference signal (SRS)). The symbols from the transmit processor 464 may be precoded by a TX MIMO processor 466 if applicable, further processed by the demodulators in transceivers 454a through 454r (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the BS 110 may perform or direct the execution of processes for the techniques described herein. The memories 442 and 482 may store data and program codes for BS 110 and UE 120, respectively. A scheduler 444 may schedule UEs for data transmission on the downlink and/or uplink.

Figure 5:
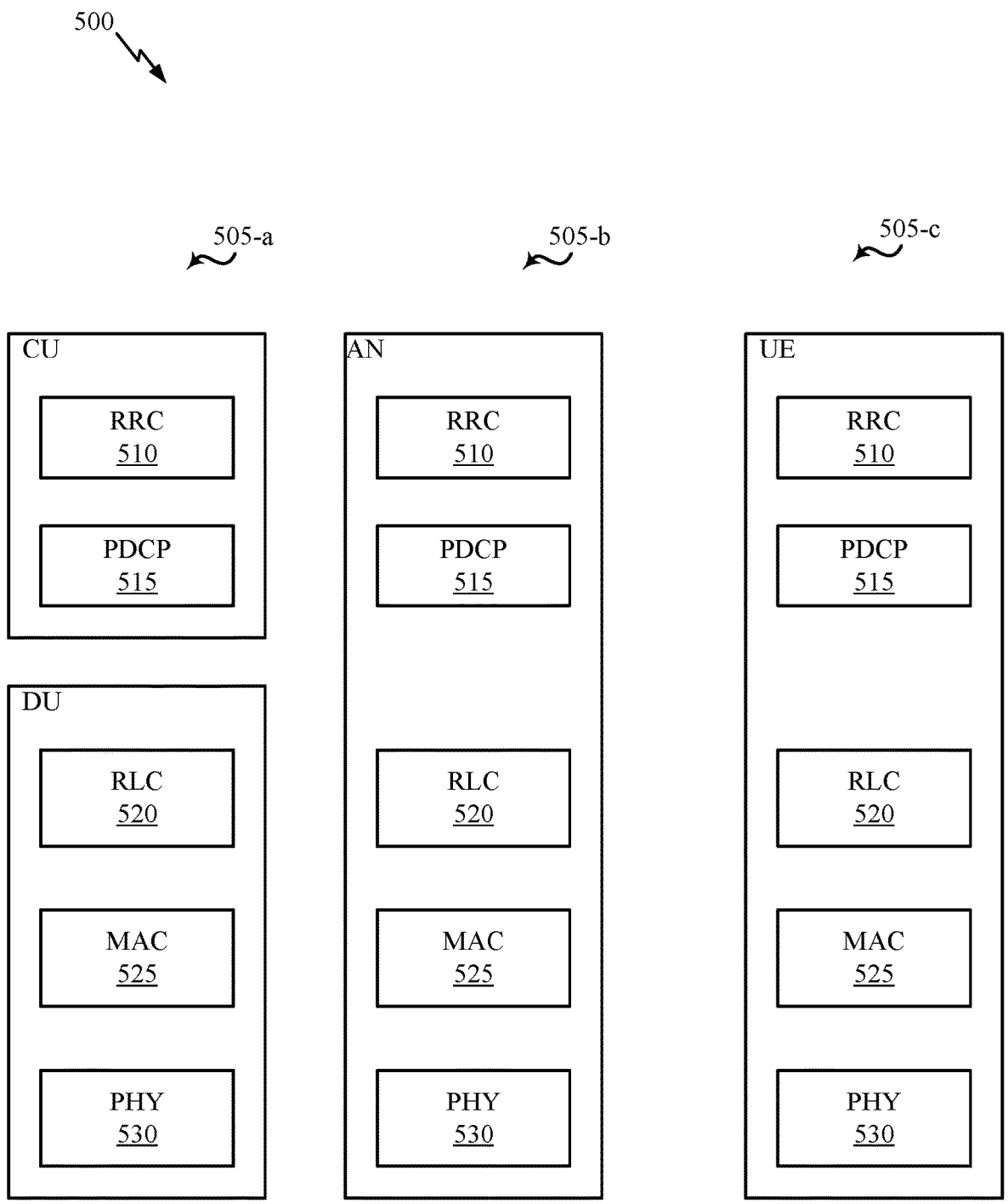
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a wireless communication system, such as a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples, the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-a shows a split implementation of a protocol stack, in which implementation of the protocol stack is split between a centralized network access device (e.g., an ANC 202 in FIG. 2) and distributed network access device (e.g., DU TRP 208 in FIG. 2). In the first option 505-a, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-a may be useful in a macro cell, micro cell, or pico cell deployment.

A second option 505-b shows a unified implementation of a protocol stack, in which the protocol stack is implemented in a single network access device. In the second option, RRC layer 510, PDCP layer 515, RLC layer 520, MAC layer 525, and PHY layer 530 may each be implemented by the AN. The second option 505-b may be useful in, for example, a femto cell deployment.

Regardless of whether a network access device implements part or all of a protocol stack, a UE may implement an entire protocol stack as shown in 505-c (e.g., the RRC layer 510, the PDCP layer 515, the RLC layer 520, the MAC layer 525, and the PHY layer 530).

In LTE, the basic transmission time interval (TTI) or packet duration is the 1 ms subframe. In NR, a subframe is still 1 ms, but the basic TTI is referred to as a slot. A subframe contains a variable number of slots (e.g., 1, 2, 4, 8, 16, ... slots) depending on the subcarrier spacing. The NR RB is 12 consecutive frequency subcarriers. NR may support a base subcarrier spacing of 15 KHz and other subcarrier spacing may be defined with respect to the base subcarrier spacing, for example, 30 kHz, 60 kHz, 120 kHz, 240 kHz, etc. The symbol and slot lengths scale with the subcarrier spacing. The CP length also depends on the subcarrier spacing.

Figure 6:
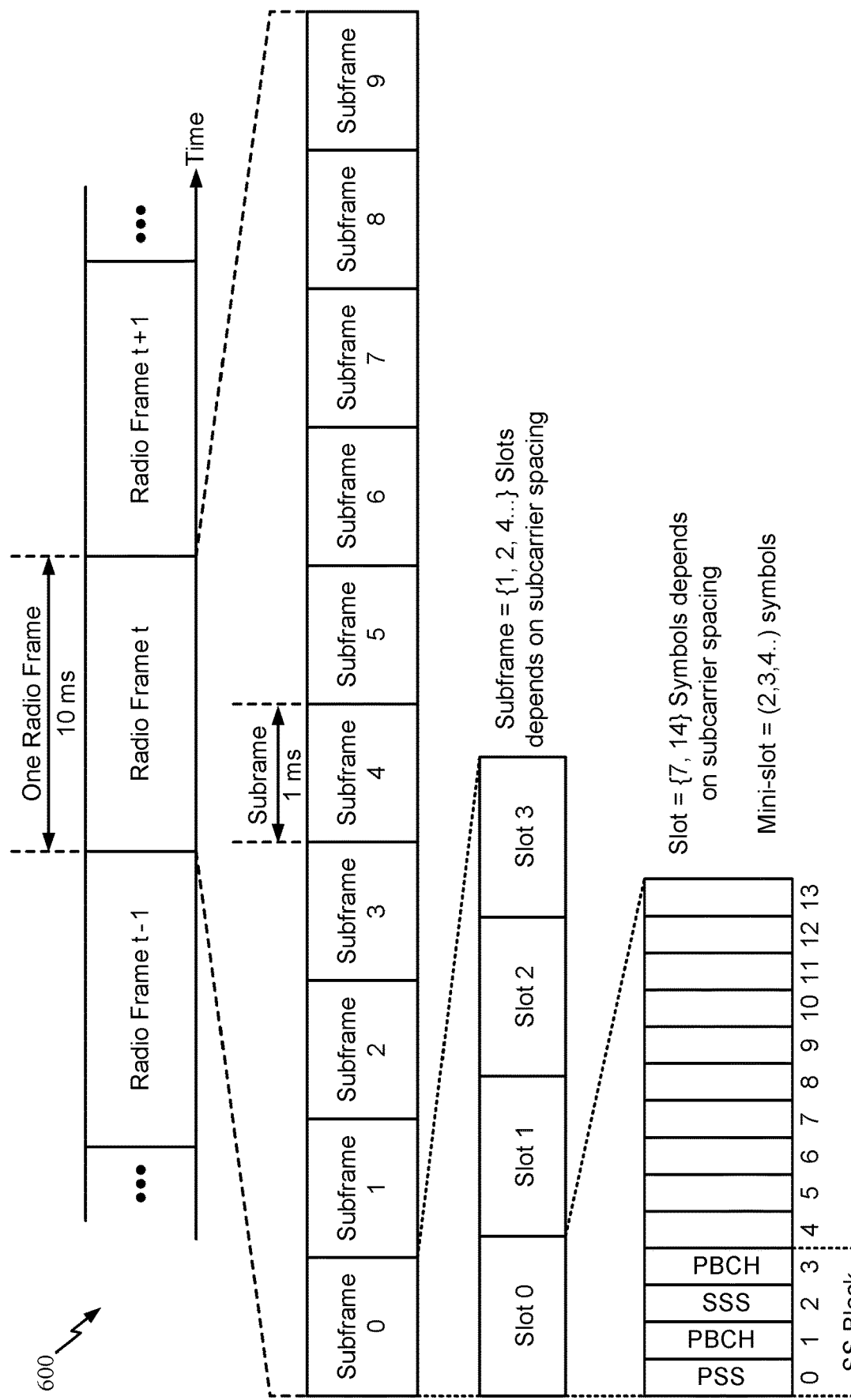
FIG. 6 illustrates an example of a frame format for a new radio (NR) system, in accordance with certain aspects of the present disclosure.

FIG. 6 is a diagram showing an example of a frame format 600 for NR. The transmission timeline for each of the downlink and uplink may be partitioned into units of radio frames. Each radio frame may have a predetermined duration (e.g., 10 ms) and may be partitioned into 10 subframes, each of 1 ms, with indices of 0 through 9. Each subframe may include a variable number of slots depending on the subcarrier spacing. Each slot may include a variable number of symbol periods (e.g., 7 or 14 symbols) depending on the subcarrier spacing. The symbol periods in each slot may be assigned indices. A mini-slot, which may be referred to as a sub-slot structure, refers to a transmit time interval having a duration less than a slot (e.g., 2, 3, or 4 symbols).

Each symbol in a slot may indicate a link direction (e.g., DL, UL, or flexible) for data transmission and the link direction for each subframe may be dynamically switched. The link directions may be based on the slot format. Each slot may include DL/UL data as well as DL/UL control information.

In NR, a synchronization signal (SS) block is transmitted. The SS block includes a PSS, a SSS, and a two symbol PBCH. The SS block can be transmitted in a fixed slot location, such as the symbols 0-3 as shown in FIG. 6. The PSS and SSS may be used by UEs for cell search and acquisition. The PSS may provide half-frame timing, the SS may provide the CP length and frame timing. The PSS and SSS may provide the cell identity. The PBCH carries some basic system information, such as downlink system bandwidth, timing information within radio frame, SS burst set periodicity, system frame number, etc. The SS blocks may be organized into SS bursts to support beam sweeping. Further system information such as, remaining minimum system information (RMSI), system information blocks (SIBs), other system information (OSI) can be transmitted on a physical downlink shared channel (PDSCH) in certain subframes.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Error Correction Coding

Many communications systems use error-correcting codes. Specifically, error-correcting codes compensate for the intrinsic unreliability of information transfer in these systems by introducing redundancy into the data stream. Low-density parity check (LDPC) codes are a particular type of error correcting codes which use an iterative coding system. In particular, Gallager codes are an early example of regular LDPC codes. LDPC codes are linear block codes in which most of the elements of its parity check matrix H are set to '0'.

LDPC codes can be represented by bipartite graphs (often referred to as "Tanner graphs"), wherein a set of variable nodes corresponds to bits of a code word (e.g., information bits or systematic bits), and a set of check nodes correspond to a set of parity-check constraints that define the code. Edges in the graph connect variable nodes to check nodes. Thus, the nodes of the graph are separated into two distinctive sets, variable nodes and check nodes, with edges connecting the two different types of nodes.

A lifted graph is created by copying a bipartite base graph (G), which may also be known as a protograph, a number of times, Z. A variable node and a check node may be considered "neighbors" if they are connected by an "edge" (i.e., the line connecting the variable node and the check node) in the graph. In addition, for each edge (e) of the bipartite base graph (G), a permutation is applied to the Z copies of edge (e) to interconnect the Z copies of G. A bit sequence having a one-to-one association with the variable node sequence is a valid codeword if, and only if, for each check node, the bits associated with all neighboring variable nodes sum to zero modulo two (i.e., they include an even number of 1's). The resulting LDPC code may be quasi-cyclic (QC) if the permutations used are cyclic.

Figures 7, 7A:
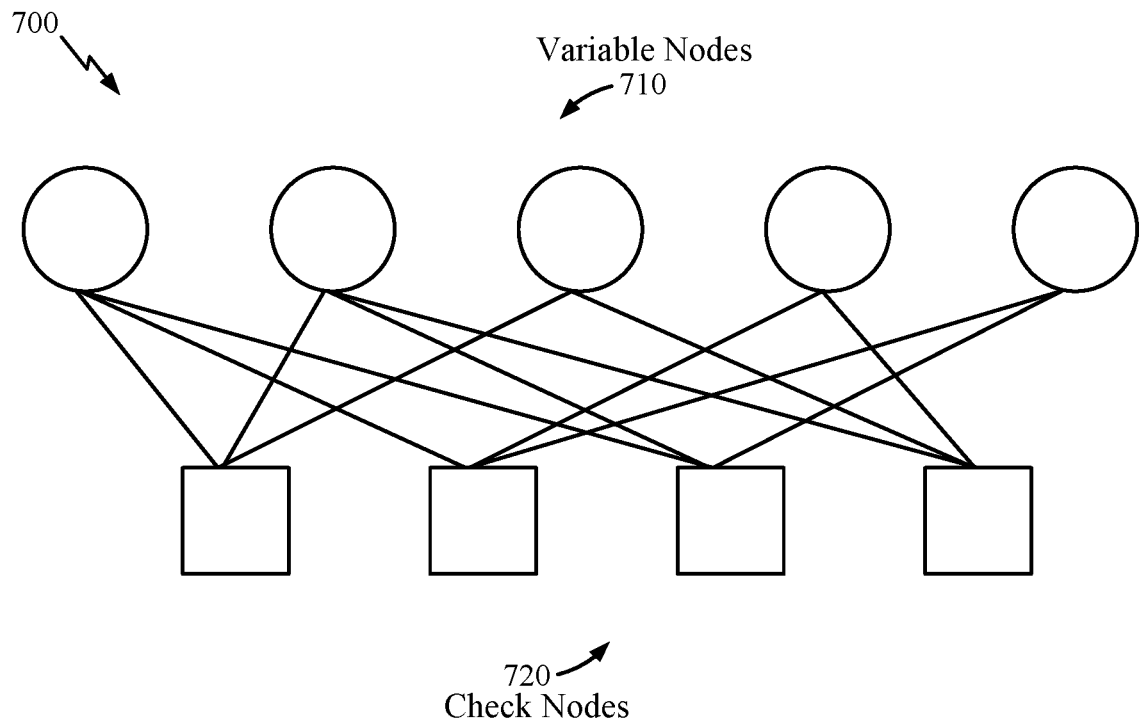
FIGS. 7-7A show graphical and matrix representations of an exemplary low density parity check (LDPC) code, according to certain aspects of the present disclosure.

FIGS. 7-7A show graphical and matrix representations of an exemplary LDPC code, in accordance with certain aspects of the present disclosure. For example, FIG. 7 shows a bipartite graph 700 representing an exemplary LDPC code. The bipartite graph 700 includes a set of 5 variable nodes 710 (represented by circles) connected to 4 check nodes 720 (represented by squares). Edges in the graph bipartite 700 connect variable nodes 710 to the check nodes 720 (represented by the lines connecting the variable nodes 710 to the check nodes 720). This graph consists of |V|=5 variable nodes and |C|=4 check nodes, connected by |E|=12 edges.

The bipartite graph may be represented by a simplified adjacency matrix, which may also be known as a parity check matrix. FIG. 7A shows a matrix representation 700A of the bipartite graph 700. The matrix representation 700A includes a parity check matrix H and a code word vector x, where x1-x5 represent bits of the code word x. The parity matrix H is used for determining whether a received signal was normally decoded. The parity check matrix H has C rows corresponding to j check nodes and V columns corresponding to i variable nodes (i.e., a demodulated symbol), where the rows represent the equations and the columns represent the bits of the code word. In FIG. 7A, matrix H has 4 rows and 5 columns corresponding to 4 check nodes and 5 variable nodes respectfully. If a j-th check node is connected to an i-th variable node by an edge, i.e., the two nodes are neighbors, then there is a 1 in the i-th column and in the j-th row of the parity check matrix H. That is, the intersection of an i-th row and a j-th column contains a "1" where an edge joins the corresponding vertices and a "0" where there is no edge. The code word vector x represents a valid code word if, and only if, Hx=0 (e.g., if, for each constraint node, the bits neighboring the constraint (via their association with variable nodes) sum to zero modulo two, i.e., they comprise an even number of ones). Thus, if the code word is received correctly, then Hx=0 (mod 2). When the product of a coded received signal and the parity check matrix H becomes '0', this signifies that no error has occurred. The parity check matrix is a C row by V column binary matrix. The rows represent the equations and the columns represent the digits in the code word.

The number of demodulated symbols or variable nodes is the LDPC code length. The number of non-zero elements in a row (column) is defined as the row (column) weight dc (dv).

The degree of a node refers to the number of edges connected to that node. This feature is illustrated in the H matrix shown in FIG. 7A where the number of edges incident to a variable node 710 is equal to the number of 1's in the corresponding column and is called the variable node degree d(v). Similarly, the number of edges connected with a check node 720 is equal to the number of ones in a corresponding row and is called the check node degree d(c).

A regular graph or code is one for which all variable nodes have the same degree, j, and all constraint nodes have the same degree, k. In this case, we say that the code is a (j, k) regular code. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z number of parallel copies of a base graph (e.g., protograph) and then interconnecting the parallel copies through permutations of edge bundles of each copy of the base graph. The base graph defines the (macro) structure of the code and consists of a number (K) of information bit-columns and a number (N) of code bit columns. Lifting the base graph a number (Z) of results in a final block length of KZ.

Thus, a larger graph can be obtained by a "copy and permute" operation where multiple copies of the base graph are made and connected to form a single lifted graph. For the multiple copies, like edges that are a set of copies of a single base edge, are permuted and connected to form a connected graph Z times larger than the base graph.

Figure 8:
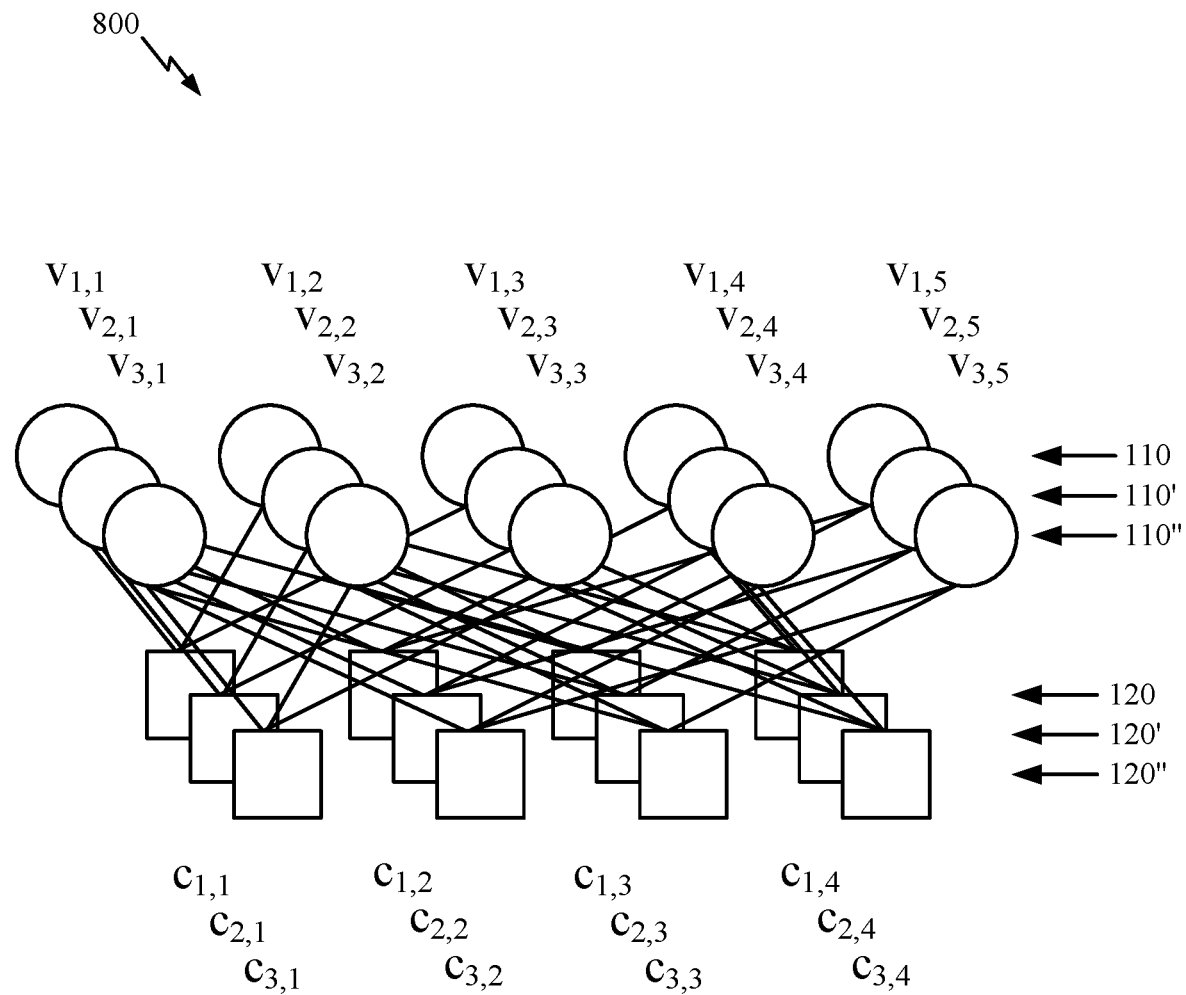
FIG. 8 graphically illustrates lifting of the LDPC code of FIG. 4A, according to certain aspects of the present disclosure.

FIG. 8 graphically illustrates the effect of making three copies 800 of the graph of FIG. 7. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To obtain derived graphs of different sizes, we can apply the "copy and permute" operation to a base graph.

A corresponding parity check matrix of the lifted graph can be constructed from the parity check matrix of the base graph by replacing each entry in the base parity check matrix with a Z×Z matrix. The 0 entries (those having no base edges) are replaced with the 0 matrix and the 1 entries (indicating a base edge) are replaced with a Z×Z permutation matrix. In the case of cyclic liftings the permutations are cyclic permutations.

A cyclically lifted LDPC code can also be interpreted as a code over the ring of binary polynomials modulo $x^Z+1$. In this interpretation, a binary polynomial, $(x)=b_0+b_1x+b_2x^2+b_{Z-1}x^{Z-1}$ may be associated to each variable node in the base graph. The binary vector $(b_0, b_1, b_2, \ldots, b_{Z-1})$ corresponds to the bits associated to Z corresponding variable nodes in the lifted graph, that is, Z copies of a single base variable node. A cyclic permutation by k of the binary vector is achieved by multiplying the corresponding binary polynomial by $x^k$ where multiplication is taken modulo $x^Z+1$. A degree d parity check in the base graph can be interpreted as a linear constraint on the neighboring binary polynomials $B_1(x), \ldots, B_d(X)$ written as $x^{k_1} B_1(x)+x^{k_2} B_2(x)+ \ldots +x^{k_d} B_d(x)=0$ where the values, $k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^Z+1$. Such a matrix may be written by giving the value k in place of $x^k$. In this case the 0 polynomial is sometimes represented as −1 and sometimes as another character in order to distinguish it from $x^0$.

Figure 9:
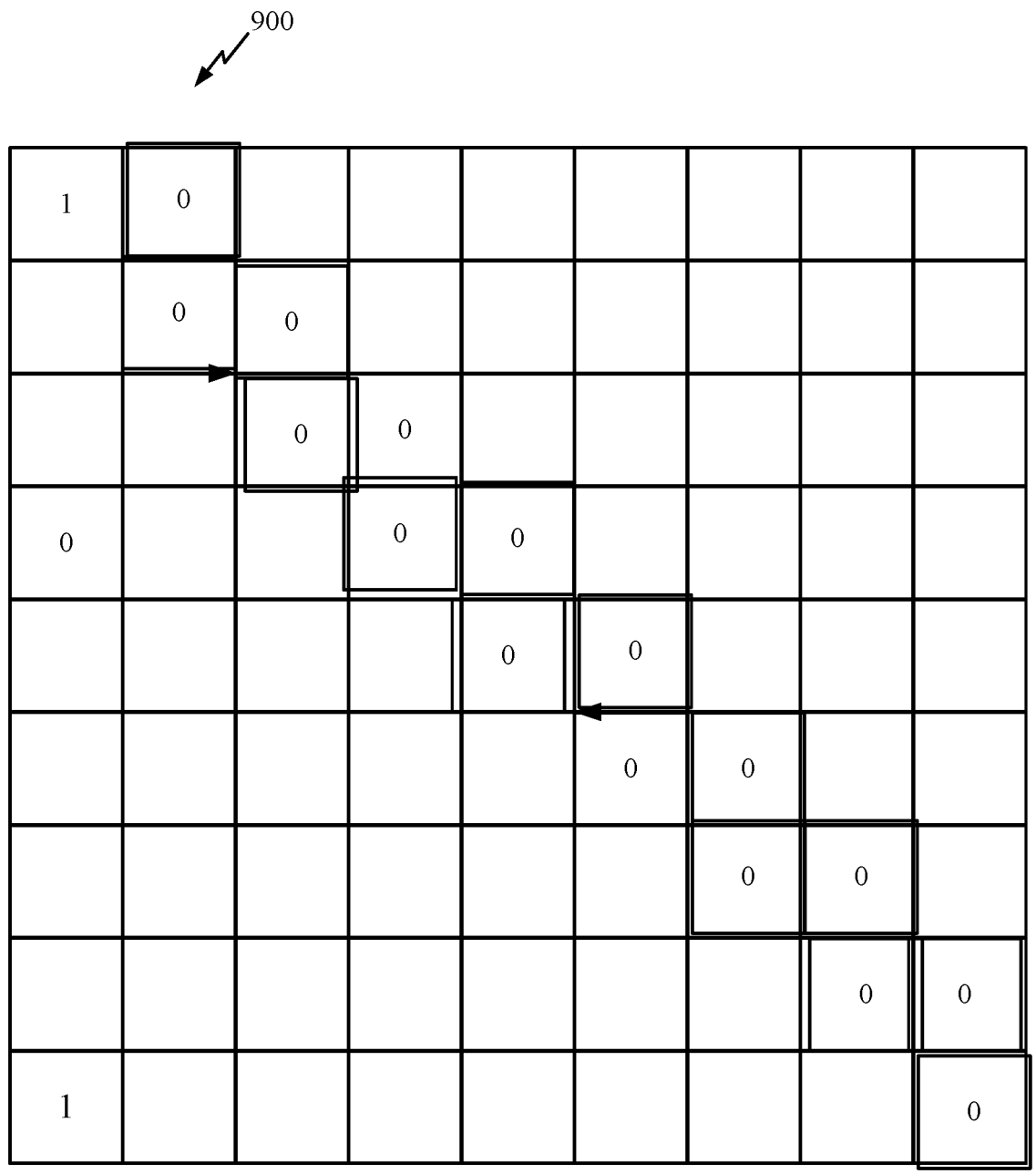
FIG. 9 is an integer representation of a matrix for a quasi-cyclic 802.11 LDPC code.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving Mc=s=Nd where c and d comprise x. In the case of quasi-cyclic codes, or cyclically lifted codes, the above algebra can be interpreted as being over the ring of binary polynomials modulo $x^Z+1$. In the case of the 802.11 LDPC codes, which are quasi-cyclic, the encoding submatrix M has an integer representation 900 as shown in FIG. 9.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 700, along the edges, and updating these messages by performing computations at the nodes based on the incoming messages. These steps may typically be repeated several times and may be referred to as message passing steps. For example, each variable node 710 in the graph 700 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). Or if the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. However, eliminating double edges in the LDPC code helps to avoid this extra complexity LDPC code designs based on cyclic lifting can be interpreted as codes over the ring of polynomials modulo may be binary polynomials modulo $x^Z+1$, where Z is the lifting size (e.g., the size of the cycle in the quasi-cyclic code). Thus encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. A more detailed discussion of lifted LDPC codes may be found, for example, in the book titled, "Modern Coding Theory," published Mar. 17, 2008, by Tom Richardson and Ruediger Urbanke.

For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint—that sockets must pair with sockets of like type—characterizes the multi-edge type concept. In a multi-edge type description, different node types can have different received distributions (e.g., the associated bits may go through different channels).

Figure 10:
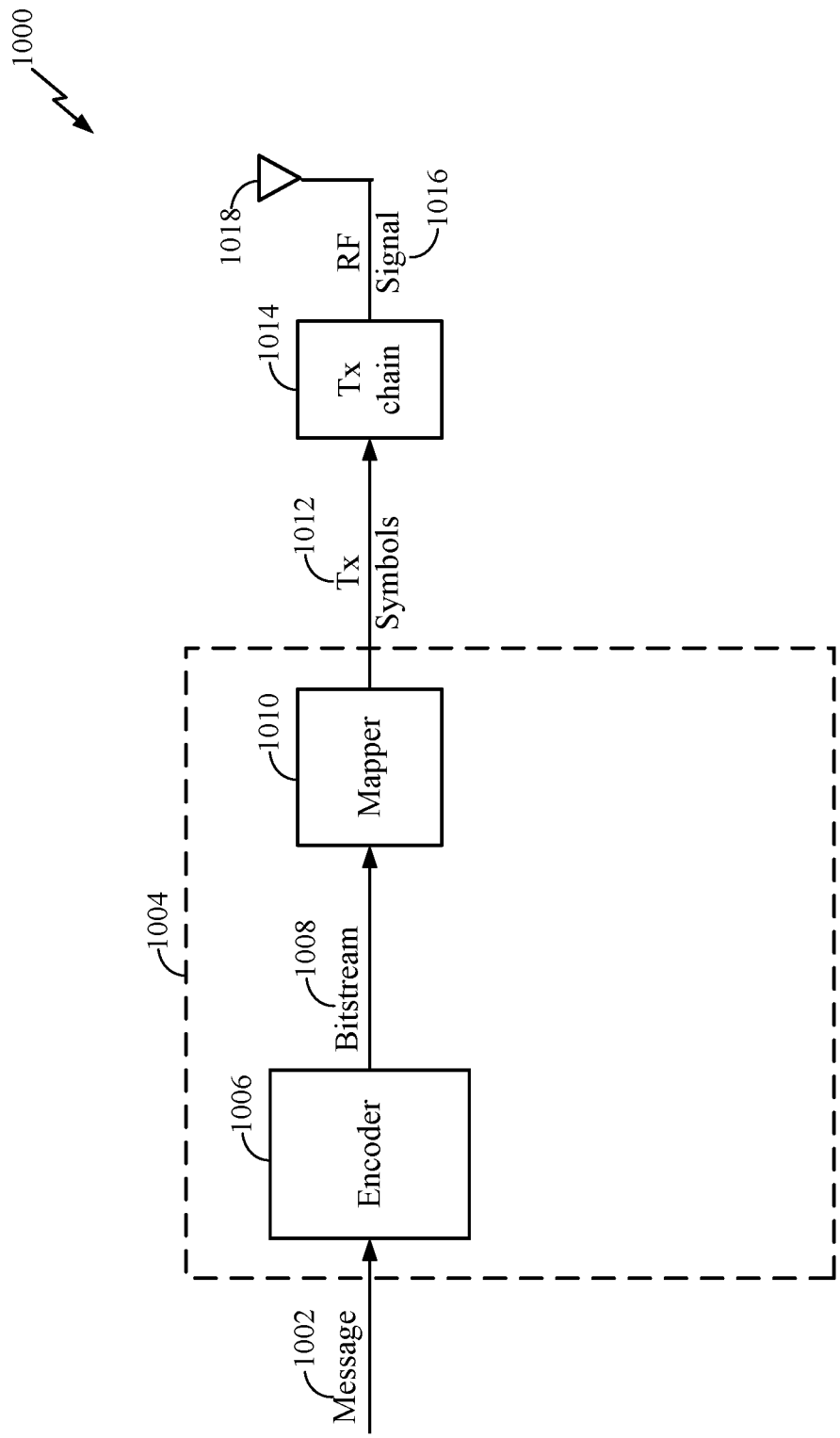
FIG. 10 is a simplified block diagram illustrating a puncturing encoder, according to certain aspects of the present disclosure.

FIG. 10 illustrates a portion of a radio frequency (RF) modem 1004 that may be configured to provide an encoded message for wireless transmission. In one example, an encoder 1006 in a base station (e.g., Node B 102 and/or transmitter system 210) (or wireless node on the reverse path) receives a message 1002 for transmission. The message 1002 may contain data and/or encoded voice or other content directed to the receiving device. The encoder 1006 encodes the message using a suitable modulation and coding scheme (MCS), typically selected based on a configuration defined by the base station or another network entity. In some cases, the encoder 1006 may encode the message, for example, using techniques described above (e.g., by using a LDPC code). An encoded bitstream 1008 produced by the encoder 1006 may then be provided to a mapper 1010 that generates a sequence of Tx symbols 1012 that are modulated, amplified and otherwise processed by Tx chain 1014 to produce an RF signal 1016 for transmission through antenna 1018.

Figure 11:
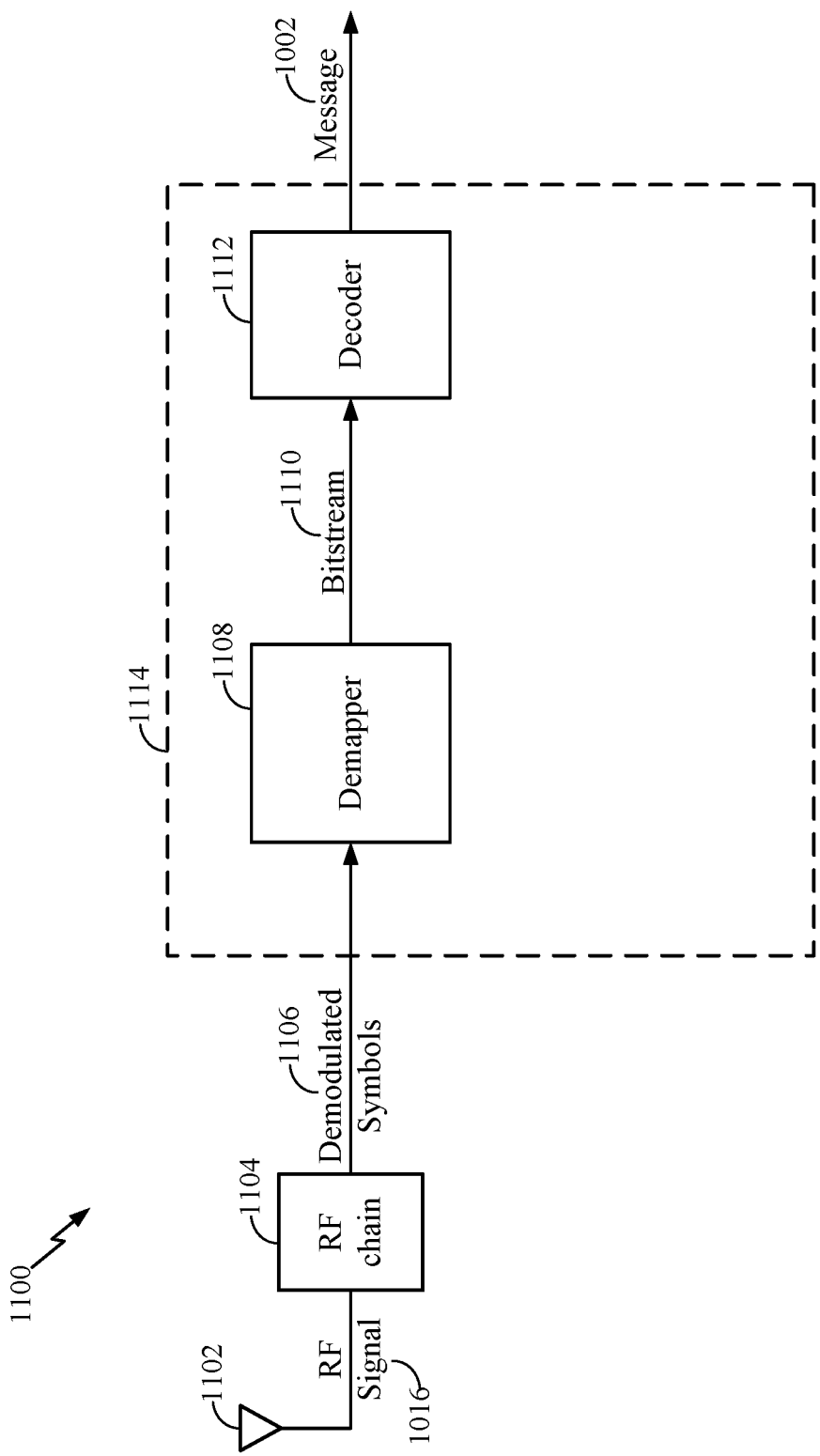
FIG. 11 is a simplified block diagram illustrating a decoder, according to certain aspects of the present disclosure.

FIG. 11 illustrates a portion of a RF modem that may be configured to receive and decode a wirelessly transmitted signal including an encoded message (e.g., a message encoded using a LDPC code as described above). In various examples, the RF modem receiving the signal may reside at the wireless node (e.g., user equipment 120), at the base station (e.g., Node B 110), or at any other suitable apparatus or means for carrying out the described functions. An antenna 1102 receives an RF signal 1116 (i.e., the RF signal 1116 produced in FIG. 11) for a wireless node (e.g., user equipment 120). An RF chain 1104 processes and demodulates the RF signal 1116 and may provide a sequence of demodulated symbols 1106 to a demapper 1108, which produces a bitstream 1110 representative of the encoded message.

A decoder 1112 may then be used to decode m-bit information strings from a bitstream that has been encoded using a coding scheme (e.g., an LDPC code). The decoder 1112 may comprise a layered LDPC decoder with a full-parallel, row-parallel, or block-parallel architecture. LDPC decoder(s) generally operate by iteratively performing local calculations and passing those results by exchanging messages within the bipartite graph 700, along the edges, and updating these messages by performing computations at the nodes based on the incoming messages. These steps may typically be repeated several times and may be referred to as message passing steps. For example, each variable node 710 in the graph 700 may initially be provided with a "soft bit" (e.g., representing the received bit of the code word) that indicates an estimate of the associated bit's value as determined by observations from the communications channel. The "soft bit" may be represented by a log-likelihood ratio (LLR) that in some aspects may be defined as the log ((probability the bit is 0)/(probability the bit is 1)). Using these LLRs the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel. According to aspects, following these decoding techniques, the decoder 1112 may decode the bitstream 1110 based on the LLRs to determine the message 1002 containing data and/or encoded voice or other content transmitted from the base station (e.g., Node B 110). The decoder may decode the bitstream 1110 in accordance with aspects of the present disclosure presented below.

Example Direct Transport Block Size Specification

In LTE, transport block size (TBS) is calculated based on a TBS index from a modulation and coding scheme (MCS) lookup table and another lookup table based on allocated resources. In 5G NR, TBS may be calculated based on allocated resources, modulation order, and target coding rates. As a result, in some cases, it can be more difficult to achieve a desired TBS in 5G NR than in LTE due to spectral efficiency. Additionally, in 5G NR for ultra reliable low-latency communication (URLLC) transmissions (and potentially other scenarios), some TBS values may be expected to be dominant (e.g., 32 bits may be dominant in an industrial employment).

In 5G NR, there are two types of MCS entries in the MCS lookup table in NR, namely explicit MCS and implicit (e.g., reserved) MCS. Explicit MCS entries specify a modulation order and a target coding rate, while implicit MCS entries only specify a modulation order. In some cases, implicit MCS entries may be used when performing a re-transmission of a TB and indicate that the same TBS from a previous transmission is used for the retransmission of the same transport block (TB).

In some cases, it may be difficult or even impossible to reach a particular TBS given certain scheduling constraints, such as an exact number of resource elements with an exact MCS. For example, if the exact number of REs needed for transmission with the exact MCS cannot be allocated, a desired TBS may not be attainable. Additionally, padding the transport block from the media access control (MAC) layer, may degrade performance. Further, there are a limited number of MCS values—some of which may not support certain TBS. Additionally, implicit MCS entries cannot be used for initial transmission, thus restricting certain TBSs.

Thus, aspects of the present disclosure provide techniques for achieving a desired TBS in 5G NR without compromising performance or scheduler flexibility (e.g., MCS entries and/or spectral efficiency and resource allocation that may be used to reach a desired/target TBS). For example, unlike LTE which keeps the spectral efficiency relatively the same within an MCS index value, aspects of the present disclosure propose techniques to achieve a desired TBS with variable spectral efficiency. In some cases, achieving such results may involve defining a new type of MCS entry in the MCS lookup table that explicitly indicate a desired TBS (e.g., rather than having to calculate the TBS).

Figure 12:
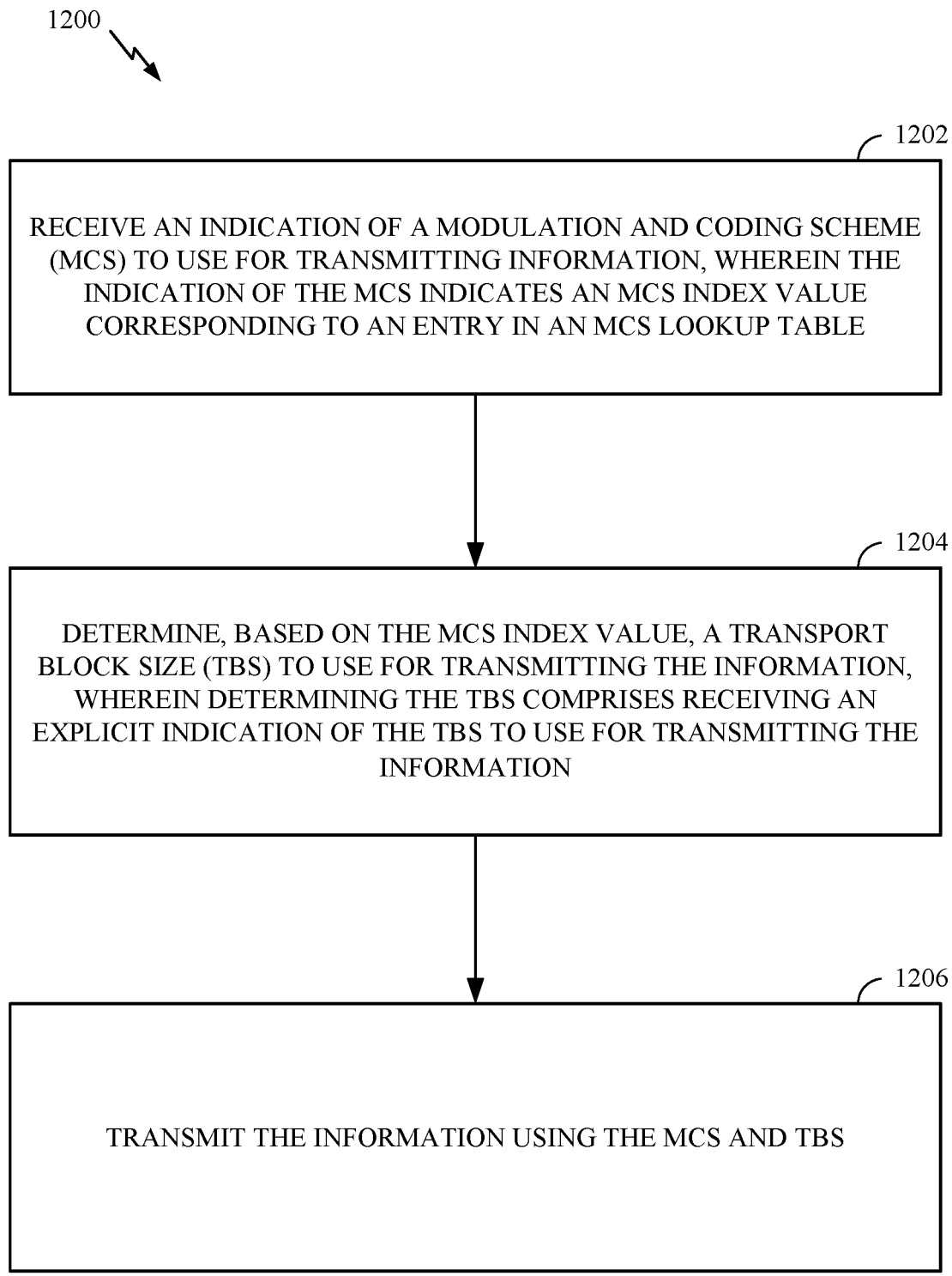
FIG. 12 illustrate example operations for wireless communications, according to certain aspects of the present disclosure.

FIG. 12 illustrates example operations 1200 for wireless communication in a network, according to certain aspects of the present disclosure. According to aspects, Operations 1200 may be performed by a wireless communications device (e.g., UE 120 and/or BS 110).

The wireless communications device may include one or more components as illustrated in FIG. 4, which may be configured to perform operations 1200 described herein. For example, the antenna 434, modulator/demodulator 432, transmit processor 420, controller/processor 440, and/or memory 442 of the base station 110, as illustrated in FIG. 4, may perform operations 1200 described herein. Additionally or alternatively, the antenna 452, demodulator/modulator 454, transmit processor 464, controller/processor 480, and/or memory 482 of the user equipment 120, as illustrated in FIG. 4, may perform operations 1200 described herein.

Operations 1200 begin at 1202 by receiving an indication of a modulation and coding scheme (MCS) to use for transmitting information, wherein the indication of the MCS indicates an MCS index value corresponding to an entry in an MCS lookup table.

At 1204, the wireless communications device determines, based on the MCS index value, a transport block size (TBS) to use for transmitting the information, wherein determining the TBS comprises receiving an explicit indication of the TBS to use for transmitting the information.

At 1206, the wireless communications device transmits the information using the MCS and TBS.

Figure 13:
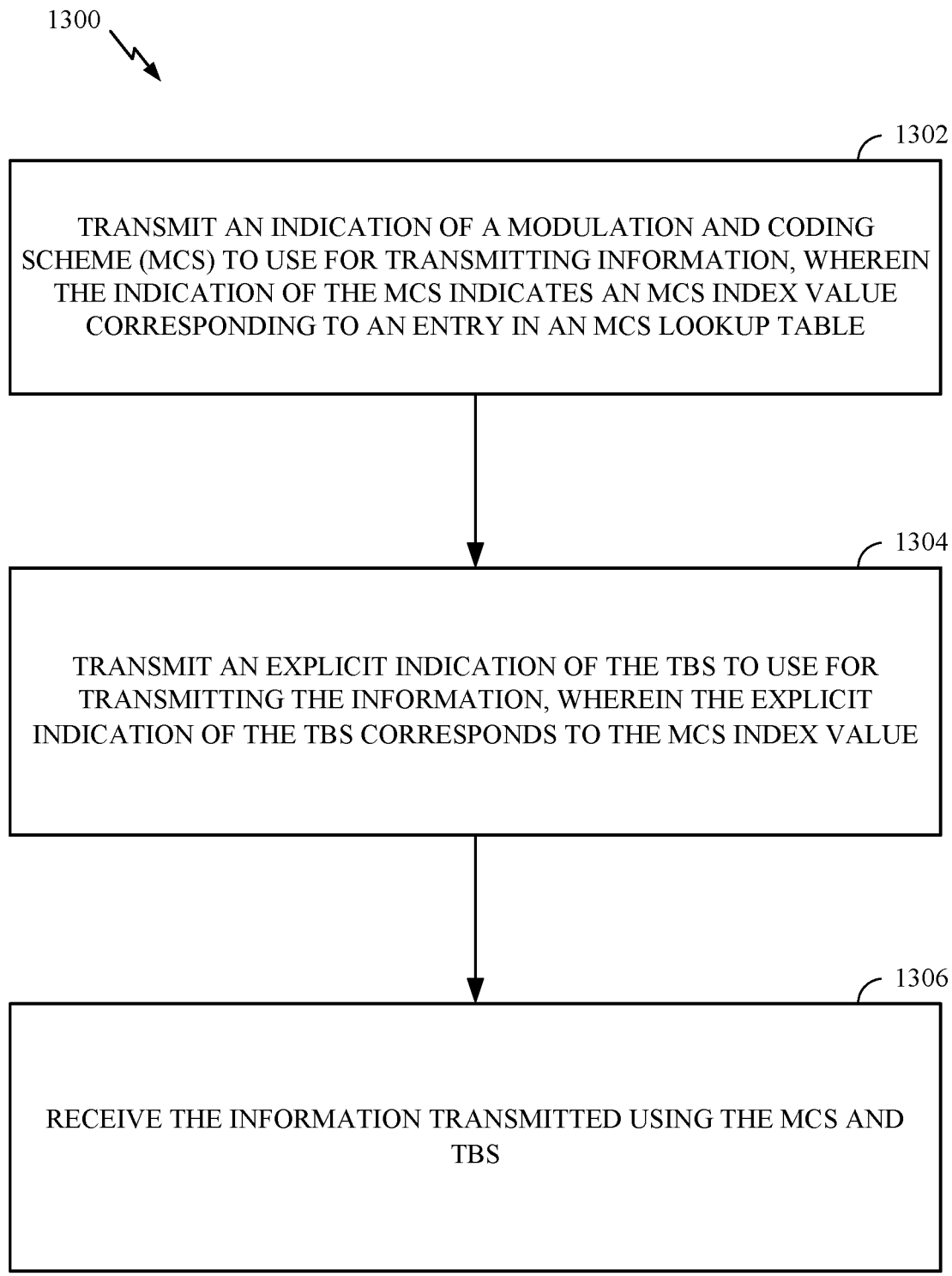
FIG. 13 illustrate example operations for wireless communications, according to certain aspects of the present disclosure.

FIG. 13 illustrates example operations 1300 for wireless communication in a network, according to certain aspects of the present disclosure. According to aspects, Operations 1300 may be performed by a wireless communications device (e.g., UE 120 and/or BS 110).

The wireless communications device may include one or more components as illustrated in FIG. 4, which may be configured to perform operations 1300 described herein. For example, the antenna 434, modulator/demodulator 432, transmit processor 420, controller/processor 440, and/or memory 442 of the base station 110, as illustrated in FIG. 4, may perform operations 1300 described herein. Additionally or alternatively, the antenna 452, demodulator/modulator 454, transmit processor 464, controller/processor 480, and/or memory 482 of the user equipment 120, as illustrated in FIG. 4, may perform operations 1300 described herein.

Operations 1300 begin at 1302 by transmitting an indication of a modulation and coding scheme (MCS) to use for transmitting information, wherein the indication of the MCS indicates an MCS index value corresponding to an entry in an MCS lookup table.

At 1304, the wireless communications device transmits an explicit indication of the TB S to use for transmitting the information, wherein the explicit indication of the TBS corresponds to the MCS index value.

At 1306, the wireless communications device receives the information transmitted using the MCS and TBS.

As noted above, aspects of the present disclosure propose techniques to achieve a desired TBS with variable spectral efficiency, unlike LTE which keeps the spectral efficiency relatively the same within an MCS index value. In some cases, achieving such results may involve defining a new type of MCS entry in the MCS lookup table (e.g., known as Explicit-TBS entries) that explicitly indicate a desired TBS (e.g., rather than having to calculate the TBS). According to aspects, in some cases, these Explicit-TBS entries may not explicitly define a coding rate to use when transmitting information.

For example, in some cases, a base station may transmit an indication of a MCS to use for transmitting information. According to aspects this MCS indication may indicate an MCS index value corresponding to an entry in an MCS lookup table. In some cases, the MCS index value may correspond to an Explicit-TBS entry in the MCS lookup table, indicating to a user equipment a particular TBS to use for transmitting the information. For example, in one case, a base station may transmit a message indicating an MCS index value (e.g., MCS 28) that corresponds to an Explicit-TBS entry in the MCS lookup table. At the user equipment, the user equipment may then use the MCS index value to determine a TBS to use for transmission of the information, as described below.

As noted, the MCS index value may correspond to an Explicit-TBS MCS entry in the MCS lookup table. In some cases, the user equipment may determine the TBS using a TBS lookup table and the MCS value indicated by the Explicit-TBS MCS entry value (e.g., using the MCS value to look up the TBS in the TBS lookup table). In other cases, the Explicit-TBS MCS value may indicate to the user equipment that the user equipment is to receive a message comprising an explicit indication of the TBS. For example, in some cases, the user equipment may receive the explicit indication of the TBS in a radio resource control (RRC) message from the network, downlink control information (DCI), a media access control-control element (MAC-CE) from the network, and/or in a semi-persistent scheduling configuration (SPS) message from the network.

According to aspects, Explicit-TBS MCS entries can be configured as in the dynamic scheduling cases and, for activation-based SPS, the TBS value (direct TBS configuration and/or explicit-TBS MCS) can be activated/deactivated. For example, in some cases, the MCS index may be included in a DCI activating SPS message that activates the SPS process. Additionally, in some cases, an explicit indication of the TBS may be RRC configured, for example, in an SPS RRC configuration.

Additionally, in some cases, a modulation order (e.g., that indicates to the UE a modulation method (e.g., QPSK, 16 QAM, 64 QAM, 256 QAM, etc) to be used) can be explicitly defined for each Explicit-TBS MCS entry in the MCS lookup table. Further, according to aspects, an indication of the modulation order may be received in an RRC message, DCI, and/or MAC-CE from the network.

In some cases, the explicit indication of the TBS may be indicated as a number of bits (e.g., a transport block size in a number of bits). According to aspects, when indicated as a number of bits, the TBS can be any value or only values that are already valid TBSs from the TBS determination procedure. In other cases, the explicit indication of the TBS may be indicated as a TBS index value in a TBS lookup table. For example, the user equipment may use the TBS index value to look up the explicit TBS in the TBS lookup table. According to aspects, this TBS lookup table may be different from LTE in that, with the proposed TBS lookup table, there is a one-to-one mapping between the TBS and TBS index, whereas a TBS index in conjunction with a number of allocated RBs was used to determine the TBS.

As noted previously, the MCS lookup table may comprise entries for explicit MCS values, implicit MCS values, and explicit-TBS MCS values. In some cases, the MCS lookup table may comprise dedicated MCS entries for each type of MCS value. That is, in some cases, the MCS lookup table may comprise distinct entries for explicit MCS values, distinct entries for implicit MCS values, and distinct entries for explicit-TBS MCS values.

In other cases, the MCS lookup table may comprise entries that are shared among two or more MCS types. For example, in some cases, explicit TBS MCS values and implicit MCS values may share the same indices (e.g., entries) in the MCS lookup table. In such a case, a user equipment may need to know how to distinguish between explicit-TB S MCS values and implicit MCS values. To distinguish between the type of MCS values when MCS values share the same entries in the MCS table, the user equipment may look to see whether an explicit TBS has been configured by the network or not. For example, if the user equipment has received a message (e.g., RRC, MAC-CE, DCI, and/or SPS activating message) indicating an explicit TBS (e.g., an explicit TBS is configured), the user equipment may assume that the MCS index value corresponds to an explicit-TBS MCS value. However, if the user equipment has not received a message indicating an explicit TBS (e.g., an explicit TBS is not configured), the user equipment may assume that the MCS index value corresponds to an implicit MCS value. Additionally, in some cases, the user equipment may assume the MCS index value corresponds to an implicit MCS value when the user equipment receives a message indicating an explicit TBS and the indicated explicit TBS is set to a special value (e.g., zero or all ones, etc.).

In some cases, explicit-TBS entries may share the same MCS indices in the MCS lookup table with both explicit MCS values and implicit MCS values. In such a case, the user equipment may determine whether the MCS index value corresponds to an explicit MCS value, an implicit MCS value, or an explicit-TBS MCS value using similar techniques as presented above. For example, if an explicit TBS is not configured, the entries in the MCS lookup table and their values may be assumed to be either explicit or implicit MCS entries as defined in the MCS lookup table. For example, if the particular MCS index value corresponds to an entry in the MCS lookup table where explicit MCS value typically is located and when an explicit TBS is not configured, the user equipment may assume that the MCS index value corresponds to an explicit MCS value. According to aspects, when an explicit MCS value is configured, the user equipment may assume that the MCS index value corresponds to an explicit-TBS MCS value. Additionally, in some cases, if an explicit TBS is configured to a special value (e.g. zero or all-ones, etc.), the user equipment may assume the MCS index value corresponds to either explicit or implicit MCS entries as defined in the table.

According to aspects, when transmitting information across a wireless channel, this information may need to be encoded, for example, using a low-density parity check (LPDC) code, as described above. In some cases, in order to encode information using an LDPC code, a user equipment may first have to make a determination of the LDPC base-graph to use to perform the encoding. This determination is traditionally based, at least in part, on a target code rate. However, when using explicitly-indicated TBSs for a first transmission, it may not be clear how to determine the LDPC base-graph since explicit-TBS MCS entries may lack an explicitly-defined target code rate.

According to aspects, to resolve the issue with determining the LDPC base-graph, aspects of the present disclosure propose techniques whereby, in some cases, the base-graph may be determined based on the TBS for explicit-TBS MCS entries. In such a case, all explicit-TBS MCS entries may share the same base-graph configuration or each entry may correspond to a unique base-graph configuration (e.g., each entry may correspond with its own base-graph configuration). Additionally, in some cases, a first group of explicit-TBS MCS entries may share a first LDPC base-graph configuration while a second group of explicit-TB S MCS entries may share a second LDPC base-graph configuration.

In other cases, an indication of a base-graph and/or base-graph configuration to use for a corresponding explicit-TB S MCS value may be fixed in a standards document and looked up by the user equipment. In such case, a single base-graph and/or base-graph configuration may correspond to all explicit-TB S MCS entries or subsets of MCS indices may be mapped to different base graphs and/or base-graph configurations.

Further, according to aspects, if the explicit-TBS MCS entries overlap with explicit MCS entries, the target code rate from latter may be used for the base-graph determination. For explicit-TBS MCS entries that do not overlap with explicit MCS entries, either the first or second option described above may be used to determine the LDPC base-graph.

According to aspects, once the LDPC base-graph has been determined, the user equipment may encode information (e.g., using the determined LDPC base-graph) and transmit the information using the MCS (e.g., received in the indication from the network) and the explicitly-indicated TBS. For example, the UE may encode information using the determined LDPC base-graph. The UE may then transmit the information according to the MCS and explicitly-indicated TBS.

According to aspects, in addition to or alternatively, a combination of MCS and RB allocation can be used to directly indicate TBS. For example, according to aspects, the combination of an MCS index and an RB allocation in a range or set of values may map to a specific TBS, which can be explicitly defined in a standards document or configured by the network (e.g., using an RRC, DCI, MAC-CE, and/or SPS activating message). According to aspects, the proposed technique is different from LTE since, in LTE, for a given MCS index, each RB allocation yields a unique TBS. However, for techniques provided herein, for a given MCS index, multiple RB allocation values may yield the same TBS.

According to aspects, in some cases, more than one channel coding scheme may be used for a data channel when transmitting the information. For example, in some cases, different channel codes may be used to encode data on a physical downlink shared channel (PDSCH) and/or a physical uplink shared channel (PUSCH). In some cases, the choice of which channel code to use may depend on the TBS and, potentially, on the target code rate.

In such a case, the channel coding scheme may be configured based on an explicit-TBS MCS entry in the MCS lookup table. For example, for explicit-TBS entries, the channel coding scheme may be determined based on the configured TBS value (e.g., the explicitly-indicated TBS) received in a message from the network (e.g., RRC, DCI, MAC-CE, SPS, etc.). In some cases, when an explicitly-indicated TBS value is used to specify the TBS, this TBS may override any other TBSs when determining the channel code for the data channel.

Further, in some cases, when explicit-TBS entries in the MCS lookup table overlap other entries in the MCS lookup table (e.g., as described above), the channel coding scheme may be determined according to the original entries (i.e., the entries in the MCS lookup table that are overlapped by the explicit-TB S MCS entries).

Additionally, in some cases, when explicit-TBS entries in the MCS lookup table overlap other entries in the MCS lookup table (e.g., as described above), the channel coding scheme may be determined according to the explicitly-indicated TBS value as well as a coding rate and modulation of the original entries (i.e., the entries in the MCS lookup table that are overlapped by the explicit-TB S MCS entries).

Additionally or alternatively, the channel coding scheme may be explicitly defined for all or a subset of entries in the MCS table. Further, according to aspects, an indication of the channel coding scheme may be received in an RRC message, a MAC-CE, or DCI from the network.

Figure 14:
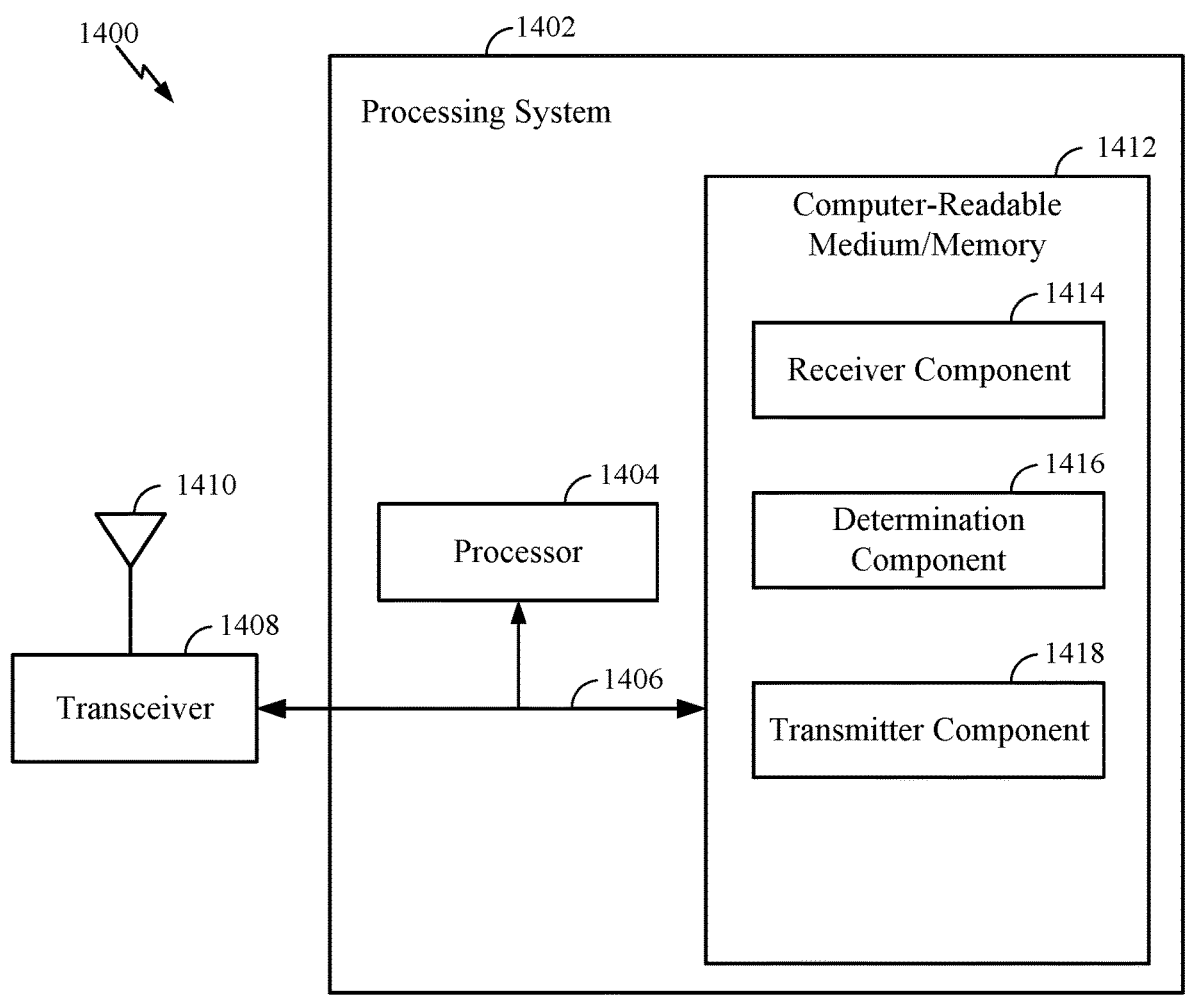
FIG. 14 illustrates a communications device that may include various components configured to perform operations for the techniques disclosed herein in accordance with aspects of the present disclosure.

FIG. 14 illustrates a communications device 1400 that may include various components (e.g., corresponding to means-plus-function components) configured to perform operations for the techniques disclosed herein, such as the operations illustrated in FIG. 12. The communications device 1400 includes a processing system 1402 coupled to a transceiver 1408. The transceiver 1408 is configured to transmit and receive signals for the communications device 1400 via an antenna 1410, such as the various signal described herein. The processing system 1402 may be configured to perform processing functions for the communications device 1400, including processing signals received and/or to be transmitted by the communications device 1400.

The processing system 1402 includes a processor 1404 coupled to a computer-readable medium/memory 1412 via a bus 1406. In certain aspects, the computer-readable medium/memory 1412 is configured to store instructions that when executed by processor 1404, cause the processor 1404 to perform the operations illustrated in FIG. 12, or other operations for performing the various techniques discussed herein.

In certain aspects, the processing system 1402 further includes a receiver component 1414 for performing the operations illustrated at 1202 of FIG. 12. Additionally, the processing system 1402 includes a determination component 1416 for performing the operations illustrated at 1204 in FIG. 12. Additionally, the processing system 1402 includes a transmitter component 1418 for performing the operations illustrated at 1206 in FIG. 12. The receiver component 1414, the determination component 1416, and the transmitter component 1418 may be coupled to the processor 1404 via bus 1406. In certain aspects, receiver component 1414, the determination component 1416, and the transmitter component 1418 may be hardware circuits. In certain aspects, the receiver component 1414, the determination component 1416, and the transmitter component 1418 may be software components that are executed and run on processor 1404.

Figure 15:
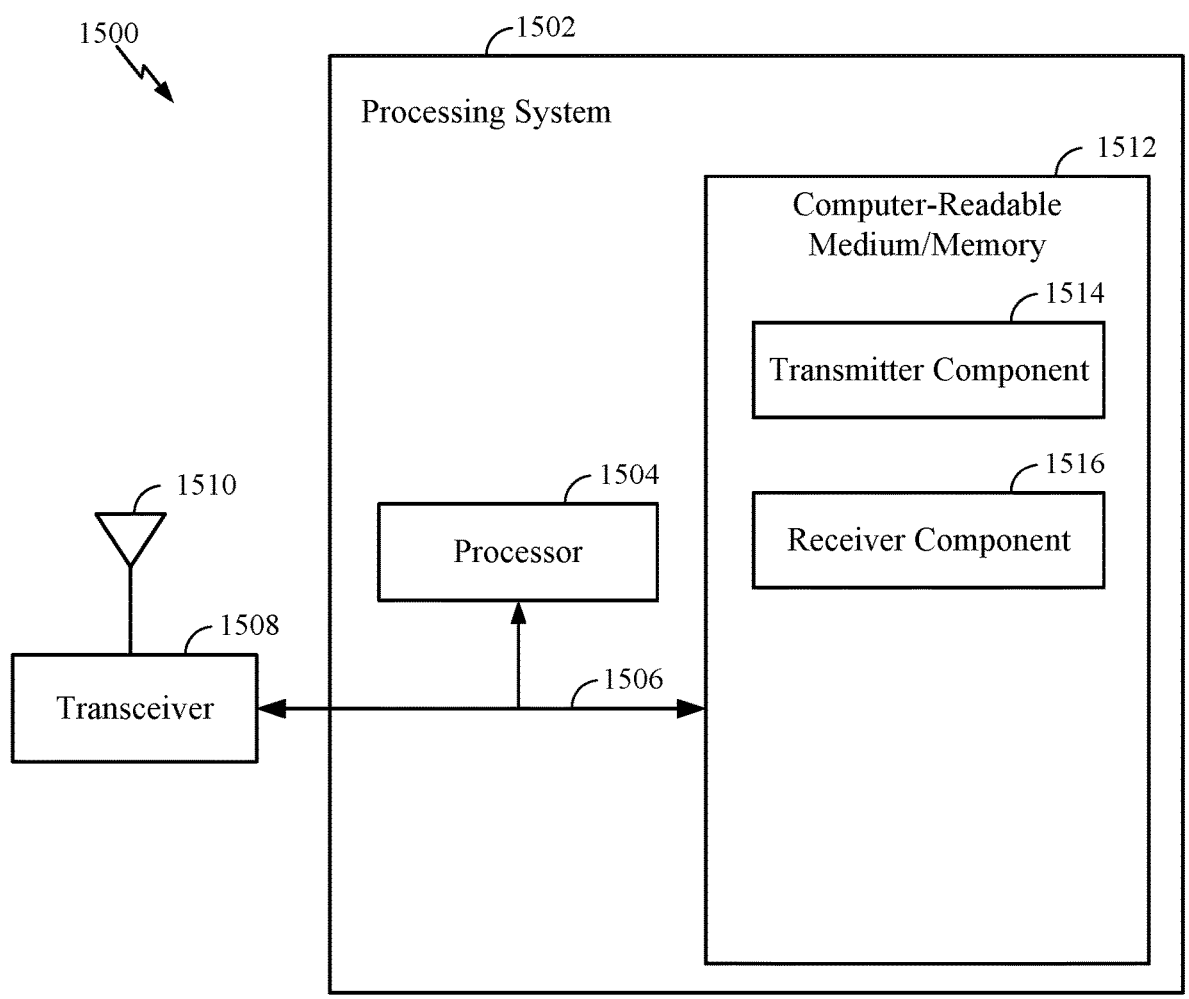
FIG. 15 illustrates a communications device that may include various components configured to perform operations for the techniques disclosed herein in accordance with aspects of the present disclosure.

FIG. 15 illustrates a communications device 1500 that may include various components (e.g., corresponding to means-plus-function components) configured to perform operations for the techniques disclosed herein, such as the operations illustrated in FIG. 13. The communications device 1500 includes a processing system 1502 coupled to a transceiver 1508. The transceiver 1508 is configured to transmit and receive signals for the communications device 1500 via an antenna 1510, such as the various signal described herein. The processing system 1502 may be configured to perform processing functions for the communications device 1500, including processing signals received and/or to be transmitted by the communications device 1500.

The processing system 1502 includes a processor 1504 coupled to a computer-readable medium/memory 1512 via a bus 1506. In certain aspects, the computer-readable medium/memory 1512 is configured to store instructions that when executed by processor 1504, cause the processor 1504 to perform the operations illustrated in FIG. 13, or other operations for performing the various techniques discussed herein.

In certain aspects, the processing system 1502 further includes a transmitter component 1514 for performing the operations illustrated at 1302 and 1304 of FIG. 13. Additionally, the processing system 1502 includes a receiver component 1516 for performing the operations illustrated at 1306 in FIG. 13. The transmitter component 1514 and the receiver component 1516 may be coupled to the processor 1504 via bus 1506. In certain aspects, the transmitter component 1514 and the receiver component 1516 may be hardware circuits. In certain aspects, the transmitter component 1514 and the receiver component 1516 may be software components that are executed and run on processor 1504.

Example Embodiments

Embodiment 1: A method for wireless communications in a network performed by a wireless communications device, including receiving an indication of a modulation and coding scheme (MCS) to use for transmitting information, wherein the indication of the MCS indicates an MCS index value corresponding to an entry in an MCS lookup table, determining, based on the MCS index value, a transport block size (TBS) to use for transmitting the information, wherein determining the TBS comprises receiving an explicit indication of the TBS to use for transmitting the information, and transmitting the information using the MCS and TBS.

Embodiment 2: The method of Embodiment 1, wherein explicit indication of the TBS is received in a radio resource control (RRC) message from the network.

Embodiment 3: The method of Embodiment 1, wherein the explicit indication of the TBS is received in a media access control-control element (MAC-CE) message received from the network.

Embodiment 4: The method of any of Embodiments 1 to 3, wherein the wireless communications device receives the explicit indication of the TBS from a TBS lookup table.

Embodiment 5: The method of any of Embodiments 1 to 4, wherein a modulation order is explicitly defined for each entry in the MCS lookup table and transmitting the information comprises transmitting the information using the modulation order.

Embodiment 6: The method of any of Embodiments 1 to 5, wherein a modulation order is received in a radio resource control (RRC) message received from the network transmitting the information comprises transmitting the information using the modulation order.

Embodiment 7: The method of any of Embodiments 1 to 6, wherein the explicit indication of the TBS indicates the TBS in a number of bits.

Embodiment 8: The method of any of Embodiments 1 to 7, wherein the explicit indication of the TBS indicates an index value corresponding to an entry in a TBS lookup table.

Embodiment 9: The method of any of Embodiments 1 to 8, wherein the MCS lookup table comprises dedicated entries for explicit MCS values, implicit MCS values, and MCS values corresponding to explicitly-indicated TBSs.

Embodiment 10: The method of any of Embodiments 1 to 9, wherein the MCS lookup table comprises entries for explicit MCS values, implicit MCS values, and MCS values corresponding to explicitly-indicated TBSs and the entries for implicit MCS values and the entries for the MCS values corresponding to explicitly-indicated TBSs share one or more of the same entries in the MCS lookup table.

Embodiment 11: The method of Embodiment 10, wherein when an explicitly-indicated TBS is not configured by the network, the shared one or more same entries in the MCS lookup table correspond to implicit MCS values and when the explicitly-indicated TBS is configured by the network, the shared one or more same entries in the MCS lookup table correspond to MCS values corresponding to explicitly-indicated TBSs.

Embodiment 12: The method of Embodiment 11, wherein when an explicitly-indicated TBS is configured by the network and the explicit indication of the TBS corresponds to a special value, the shared one or more same entries in the MCS lookup table correspond to implicit MCS values.

Embodiment 13: The method of any of Embodiments 1 to 9, wherein the MCS lookup table comprises entries for explicit MCS values, implicit MCS values, and MCS values corresponding to explicitly-indicated TBSs and the MCS values corresponding to explicitly-indicated TBSs share one or more of the same entries in the MCS lookup table as the entries for explicit MCS values and entries for the implicit MCS values.

Embodiment 14: The method of any of Embodiments 1 to 13, wherein the explicit indication of the TBS lacks an indication of a target code rate and further comprising determining a low-density parity check (LDPC) base-graph to use for encoding the information based, at least in part, on the explicit indication of the TBS.

Embodiment 15: The method of any of Embodiments 1 to 14, wherein the MCS lookup table comprises entries for explicit MCS values, entries for implicit MCS values, and entries for MCS values corresponding to explicitly-indicated TBSs and one of: each entry for MCS values corresponding to explicitly-indicated TBSs correspond to a same LDPC base-graph configuration; each entry for MCS values corresponding to explicitly-indicated TBSs correspond to a different unique base-graph configuration; or a first group of entries for MCS values corresponding to explicitly-indicated TBSs correspond to a first base-graph configuration and a second group of entries for MCS values corresponding to explicitly-indicated TBSs correspond to a second base-graph configuration.

Embodiment 16: The method of any of Embodiments 1 to 14, wherein the MCS lookup table comprises entries for explicit MCS values, entries for implicit MCS values, and entries for MCS values corresponding to explicitly-indicated TBSs; and when the MCS values corresponding to explicitly-indicated TBSs share the same entries as the explicit MCS values, determining the LDPC base-graph is based further on a target code rate associated with a corresponding explicit MCS value.

Embodiment 17: The method of any of Embodiments 1 to 16, wherein the explicit indication of the TBS is received in a semi-persistent scheduling (SPS) message.

Embodiment 18: The method of any of Embodiments 1 to 17, wherein the explicit indication of the TBS is activated and deactivated according to an SPS configuration.

Embodiment 19: The method of any of Embodiments 1 to 18, further comprising determining the TBS based further on MCS index value and a resource block allocation.

Embodiment 20: The method of any of Embodiments 1 to 19, wherein a combination of the MCS index value and the resource block value map to the determined TBS when the combination is within a certain range.

Embodiment 21: A wireless communications in a network performed by a wireless communications device, including transmitting an indication of a modulation and coding scheme (MCS) to use for transmitting information, wherein the indication of the MCS indicates an MCS index value corresponding to an entry in an MCS lookup table, transmitting an explicit indication of the TBS to use for transmitting the information, wherein the explicit indication of the TBS corresponds to the MCS index value, and receiving the information transmitted using the MCS and TBS.

Embodiment 22: The method of Embodiment 21, wherein the explicit indication of the TBS is transmitted in a radio resource control (RRC) message from the network.

Embodiment 23: The method of Embodiment 21, wherein the explicit indication of the TBS is transmitted in a media access control-control element (MAC-CE) message received from the network.

Embodiment 24: The method of any of Embodiments 21 to 23, wherein the explicit indication of the TBS indicates the TBS in a number of bits.

Embodiment 25: The method of any of Embodiments 21 to 24, wherein the explicit indication of the TBS indicates an index value corresponding to an entry in a TBS lookup table.

Embodiment 26: The method of any of Embodiments 21 to 25, wherein the explicit indication of the TBS is transmitted in a semi-persistent scheduling (SPS) message.

Embodiment 27: The method of any of Embodiments 21 to 26, wherein the explicit indication of the TBS is activated and deactivated according to an SPS configuration.

Embodiment 28: An apparatus for wireless communication in a network performed by a wireless communications device, comprising: at least one processor configured to: receive an indication of a modulation and coding scheme (MCS) to use for transmitting information, wherein the indication of the MCS indicates an MCS index value corresponding to an entry in an MCS lookup table; determine, based on the MCS index value, a transport block size (TBS) to use for transmitting the information, wherein determining the TBS comprises receiving an explicit indication of the TBS to use for transmitting the information; and transmit the information using the MCS and TBS; and a memory coupled with the at least one processor.

Embodiment 29: An apparatus for wireless communication in a network performed by a wireless communications device, comprising: at least one processor configured to: transmit an indication of a modulation and coding scheme (MCS) to use for transmitting information, wherein the indication of the MCS indicates an MCS index value corresponding to an entry in an MCS lookup table; transmit an explicit indication of the TB S to use for transmitting the information, wherein the explicit indication of the TBS corresponds to the MCS index value; and receive the information transmitted using the MCS and TBS; and a memory coupled with the at least one processor.

Embodiment 30: An apparatus for wireless communication in a network performed by a wireless communications device, comprising means for receiving an indication of a modulation and coding scheme (MCS) to use for transmitting information, wherein the indication of the MCS indicates an MCS index value corresponding to an entry in an MCS lookup table, means for determining, based on the MCS index value, a transport block size (TBS) to use for transmitting the information, wherein determining the TBS comprises receiving an explicit indication of the TBS to use for transmitting the information, and means for transmitting the information using the MCS and TBS.

Embodiment 31: An apparatus for wireless communication in a network performed by a wireless communications device, comprising means for transmitting an indication of a modulation and coding scheme (MCS) to use for transmitting information, wherein the indication of the MCS indicates an MCS index value corresponding to an entry in an MCS lookup table, means for transmitting an explicit indication of the TBS to use for transmitting the information, wherein the explicit indication of the TBS corresponds to the MCS index value, and means for receiving the information transmitted using the MCS and TBS.

Embodiment 32: A non-transitory computer-readable medium for wireless communication in a network performed by a wireless communications device, comprising instructions that, when executed by at least one processor, cause the at least one processor to receive an indication of a modulation and coding scheme (MCS) to use for transmitting information, wherein the indication of the MCS indicates an MCS index value corresponding to an entry in an MCS lookup table, determine, based on the MCS index value, a transport block size (TBS) to use for transmitting the information, wherein determining the TBS comprises receiving an explicit indication of the TBS to use for transmitting the information, and transmit the information using the MCS and TBS.

Embodiment 33: A non-transitory computer-readable medium for wireless communication in a network performed by a wireless communications device, comprising instructions that, when executed by at least one processor, cause the at least one processor to transmit an indication of a modulation and coding scheme (MCS) to use for transmitting information, wherein the indication of the MCS indicates an MCS index value corresponding to an entry in an MCS lookup table, transmit an explicit indication of the TBS to use for transmitting the information, wherein the explicit indication of the TBS corresponds to the MCS index value, and receive the information transmitted using the MCS and TBS.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user equipment 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For example, instructions for performing the operations described herein and illustrated in FIG. 12 and FIG. 13.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of wireless communications in a network performed by a wireless communications device, comprising:
   receiving an index value that corresponds to an entry in a modulation and coding scheme (MCS) lookup table, wherein:
      the MCS lookup table comprises entries for explicit MCS values, implicit MCS values, and MCS values corresponding to explicit transport block sizes (TBSs), and
      the index value indicates an MCS value corresponding to an explicit TBS to use for transmitting information;
   obtaining the explicit TBS to use for transmitting the information, comprising:
      determining the MCS value from the MCS lookup table using the index value; and
      determining the explicit TBS from a TBS lookup table using the MCS value determined from the MCS lookup table, wherein the TBS lookup table includes a one-to-one mapping between the MCS value determined from the MCS lookup table and the explicit TBS determined from the TBS lookup table; and
   transmitting the information using the MCS and the explicit TBS.

2. The method of claim 1, wherein:
   a modulation order is explicitly defined for each entry in the MCS lookup table; and
   transmitting the information comprises transmitting the information using the modulation order.

3. The method of claim 1, wherein:
   a modulation order is received in a radio resource control (RRC) message received from the network; and
   transmitting the information comprises transmitting the information using the modulation order.

4. The method of claim 1, wherein the explicit TBS indicates the TBS as a number of bits.

5. The method of claim 1, wherein the MCS lookup table comprises dedicated entries for the explicit MCS values, the implicit MCS values, and the MCS values corresponding to the explicit TBSs.

6. The method of claim 1, wherein:
the entries for the implicit MCS values and the entries for the MCS values corresponding to the explicit TBSs share one or more of the same entries in the MCS lookup table.

7. The method of claim 6, wherein:
when an explicitly-indicated TBS is not configured by the network, the shared one or more same entries in the MCS lookup table correspond to the implicit MCS values; and
when the explicitly-indicated TBS is configured by the network, the shared one or more same entries in the MCS lookup table correspond to the MCS values corresponding to explicitly-indicated TBSs.

8. The method of claim 6, wherein when an explicitly-indicated TBS is configured by the network and the explicit TBS corresponds to a special value, the shared one or more same entries in the MCS lookup table correspond to the implicit MCS values.

9. The method of claim 1, wherein:
the MCS values corresponding to the explicit TBSs share one or more of the same entries in the MCS lookup table as the entries for the explicit MCS values and entries for the implicit MCS values.

10. The method of claim 1, wherein the explicit TBS lacks an indication of a target code rate; and
further comprising determining a low-density parity check (LDPC) base-graph to use for encoding the information based, at least in part, on the explicit TBS.

11. The method of claim 10, wherein one of:
each entry for MCS values corresponding to explicitly-indicated TBSs correspond to a same LDPC base-graph configuration;
each entry for MCS values corresponding to explicitly-indicated TBSs correspond to a different unique base-graph configuration; or
a first group of entries for MCS values corresponding to explicitly-indicated TBSs correspond to a first base-graph configuration and a second group of entries for MCS values corresponding to explicitly-indicated TBSs correspond to a second base-graph configuration.

12. The method of claim 10, wherein:
when the MCS values corresponding to explicitly-indicated TBSs share the same entries as the explicit MCS values, determining the LDPC base-graph is based further on a target code rate associated with a corresponding explicit MCS value.

13. The method of claim 1, wherein the explicit TBS is received in a semi-persistent scheduling (SPS) message.

14. The method of claim 13, wherein the explicit TBS is activated and deactivated according to an SPS configuration.

15. The method of claim 1, further comprising determining the explicit TBS based on a resource block allocation.

16. The method of claim 15, wherein a combination of the index value and the resource block allocation map to the explicit TBS when the combination is within a certain range.

17. A method of wireless communications in a network performed by a wireless communications device, comprising:
transmitting an index value that corresponds to an entry in a modulation and coding scheme (MCS) lookup table, wherein:
the MCS lookup table comprises entries for explicit MCS values, implicit MCS values, and MCS values corresponding to explicit transport block sizes (TBSs), and
the index value indicates an MCS value corresponding to an explicit TBS to use for transmitting information;
transmitting the explicit TBS to use for transmitting the information, wherein the explicit TBS is based on TBS lookup table that includes a one-to-one mapping between the MCS value from the MCS lookup table and the explicit TBS to use for transmitting the information; and
receiving the information based on the MCS value and the explicit TBS.

18. The method of claim 17, wherein the explicit TBS is indicated as a number of bits.

19. The method of claim 17, wherein the explicit TBS is transmitted in a semi-persistent scheduling (SPS) message.

20. The method of claim 17, wherein the explicit TBS is activated and deactivated according to an SPS configuration.

21. An apparatus for wireless communication in a network performed by a wireless communications device, comprising:
at least one processor configured to:
receive an index value that corresponds to an entry in a modulation and coding scheme (MCS) lookup table, wherein:
the MCS lookup table comprises entries for explicit MCS values, implicit MCS values, and MCS values corresponding to explicit transport block sizes (TBSs), and
the index value indicates an MCS value corresponding to an explicit TBS to use for transmitting information;
obtain the explicit TBS to use for transmitting the information, wherein in order to receive the explicit TBS the processor is configured to:
determine the MCS value from the MCS lookup table using the index value; and
determine the explicit TBS from a TBS lookup table using the MCS value determined from the MCS lookup table, wherein the TBS lookup table includes a one-to-one mapping between the MCS determined from the MCS lookup table and the explicit TBS determined from the TBS lookup table; and
transmit the information using the MCS value and the explicit TBS; and
a memory coupled with the at least one processor.

22. An apparatus for wireless communication in a network performed by a wireless communications device, comprising:
at least one processor configured to:
transmit an index value that corresponds to an entry in a modulation and coding scheme (MCS) lookup table, wherein:
the MCS lookup table comprises entries for explicit MCS values, implicit MCS values, and MCS values corresponding to explicit transport block sizes (TBSs), and
the index value indicates an MCS value corresponding to an explicit TBS to use for transmitting information;
transmit the explicit TBS to use for transmitting the information, wherein the explicit TBS is based on TBS lookup table that includes a one-to-one mapping between the MCS value from the MCS lookup table and the explicit TBS to use for transmitting the information; and receive the information based on the MCS value and the explicit TBS; and a memory coupled with the at least one processor.

\* \* \* \* \*